(12) United States Patent
Kamikawa et al.

(10) Patent No.: US 6,491,045 B2
(45) Date of Patent: *Dec. 10, 2002

(54) APPARATUS FOR AND METHOD OF CLEANING OBJECT TO BE PROCESSED

(75) Inventors: Yuji Kamikawa, Kikuchi-gun; Kinya Ueno, Nirasaki; Satoshi Nakashima, Tamana-gun, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/970,696

(22) Filed: Oct. 5, 2001

(65) Prior Publication Data

US 2002/0017315 A1 Feb. 14, 2002

Related U.S. Application Data

(60) Continuation of application No. 09/432,422, filed on Nov. 2, 1999, now Pat. No. 6,319,329, which is a division of application No. 09/010,851, filed on Jan. 22, 1998, now Pat. No. 6,131,588.

(30) Foreign Application Priority Data

Jan. 24, 1997 (JP) ................................................ 9-11553

(51) Int. Cl.[7] .................................................. B08B 3/10
(52) U.S. Cl. ..................... 134/102.3; 134/105; 134/108; 134/113; 134/200
(58) Field of Search .............. 134/102.3, 902, 134/200, 105, 107, 95.1, 61

(56) References Cited

U.S. PATENT DOCUMENTS

| | | | |
|---|---|---|---|
| 4,077,467 A | * | 3/1978 | Spigarelli |
| 4,493,333 A | | 1/1985 | Layton ........................ 134/902 |
| 4,558,524 A | * | 12/1985 | Peck et al. |
| 4,777,970 A | * | 10/1988 | Kusuhara |
| 4,879,041 A | | 11/1989 | Kurokawa et al. .......... 210/640 |

(List continued on next page.)

FOREIGN PATENT DOCUMENTS

| JP | 61152020 | 7/1986 |
|---|---|---|
| JP | 81230 | 3/1989 |
| JP | 01081230 | 3/1989 |
| JP | 02156531 | 6/1990 |
| JP | 3-70134 | 3/1991 |

(List continued on next page.)

OTHER PUBLICATIONS

Patent Abstract of Japan, vol. 015, No. 233 (E–1077), Jun. 14, 1991, & JP 03 070134 A (Fujitsu Ltd) Mar. 26, 1991.

*Primary Examiner*—Frankie L. Stinson
(74) *Attorney, Agent, or Firm*—Smith, Gambrell & Russell, LLP

(57) ABSTRACT

A method for cleaning an object to be processed in which the atmosphere in a drying chamber is replaced by an inert gas prior to placing an object to be cleaned from an external environment into the chamber. The object is then transported by an elongated retaining member from the drying chamber through a lower opening in the chamber into a processing bath disposed below the chamber. The object is then cleaned in the processing bath. The object is then transported from the processing bath to the drying chamber where it is dried by filling the atmosphere of the drying chamber with organic solvent. The cleaning process in the cleaning bath is carried out while the bath is screened by a nitrogen-gas curtain. The method also includes opening a lid of the chamber prior to insertion of the object into the chamber and closing the lid after insertion of the object, as well as the opening and closing of the lower opening in the chamber. The method may also include exhausting an atmosphere in the drying chamber while supplying inert gas, decompressing the atmosphere in the drying chamber as well as chemical cleaning, water cleaning, and ozone cleaning of the object.

9 Claims, 21 Drawing Sheets

U.S. PATENT DOCUMENTS

| | | | |
|---|---|---|---|
| 4,983,223 A | * | 1/1991 | Gesner |
| 4,983,527 A | | 1/1991 | Yoshizawa ................. 134/902 |
| 5,105,556 A | | 4/1992 | Kurokawa et al. ............. 34/12 |
| 5,156,173 A | | 10/1992 | Keyser et al. ............. 134/108 |
| 5,267,581 A | | 12/1993 | Moriaud .................... 134/105 |
| 5,327,920 A | | 7/1994 | Gerard et al. |
| 5,362,274 A | | 11/1994 | Seiichiro |
| 5,368,649 A | * | 11/1994 | Tsukazaki |
| 5,369,891 A | * | 12/1994 | Kamiakwa |
| 5,443,540 A | * | 8/1995 | Kamiakwa |
| 5,487,378 A | | 1/1996 | Ohmi et al. |
| 5,488,964 A | | 2/1996 | Murakami et al. |
| 5,499,642 A | | 3/1996 | Ohmi |
| 5,520,744 A | | 5/1996 | Fujikawa et al. |
| 5,599,389 A | | 2/1997 | Lenglen ..................... 134/105 |
| 5,657,553 A | * | 8/1997 | Tarui et al. |
| 5,858,106 A | | 1/1999 | Ohmi et al. |
| 5,951,779 A | | 9/1999 | Koyanagi et al. |
| 6,001,191 A | * | 12/1999 | Kamikawa et al. |
| 6,171,403 B1 | | 1/2000 | Kamikawa |
| 6,045,624 A | * | 4/2000 | Kamikawa et al. |
| 6,068,002 A | * | 5/2000 | Kamikawa et al. |
| 6,131,588 A | | 10/2000 | Kamikawa et al. |
| 6,158,449 A | | 12/2000 | Kamikawa |
| 6,164,297 A | | 12/2000 | Kamikawa |

FOREIGN PATENT DOCUMENTS

| | | |
|---|---|---|
| JP | 30370134 | 3/1991 |
| JP | 4-225230 | 8/1992 |
| JP | 04251930 | 9/1992 |
| JP | 05190526 | 7/1993 |
| JP | 06077203 | 3/1994 |
| JP | 06283496 | 10/1994 |
| JP | 06283497 | 10/1994 |
| JP | 326073 | 11/1994 |
| JP | 07130699 | 5/1995 |
| JP | 08148457 | 6/1996 |
| SU | 565727 | 6/1975 |
| SU | 565727 | 7/1977 |
| SU | 707994 | 1/1980 |

* cited by examiner

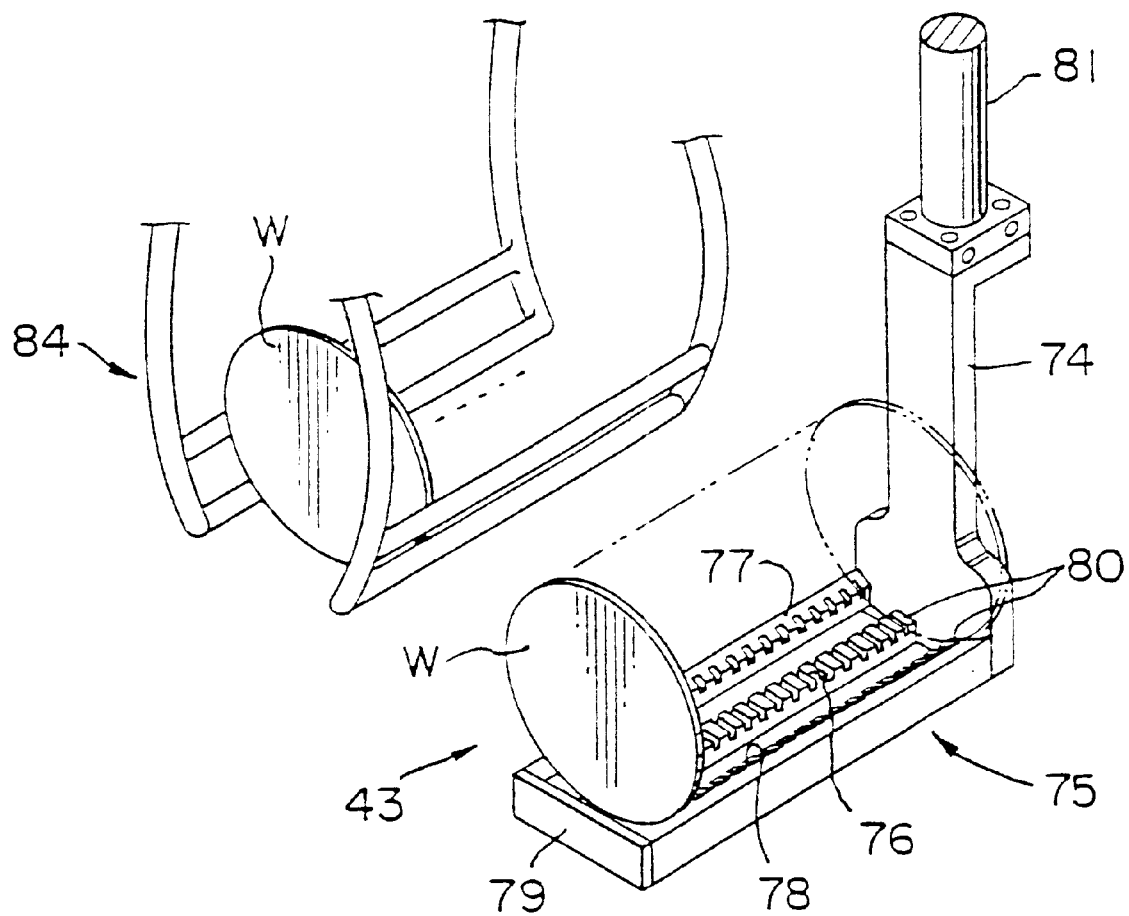
F I G. 12

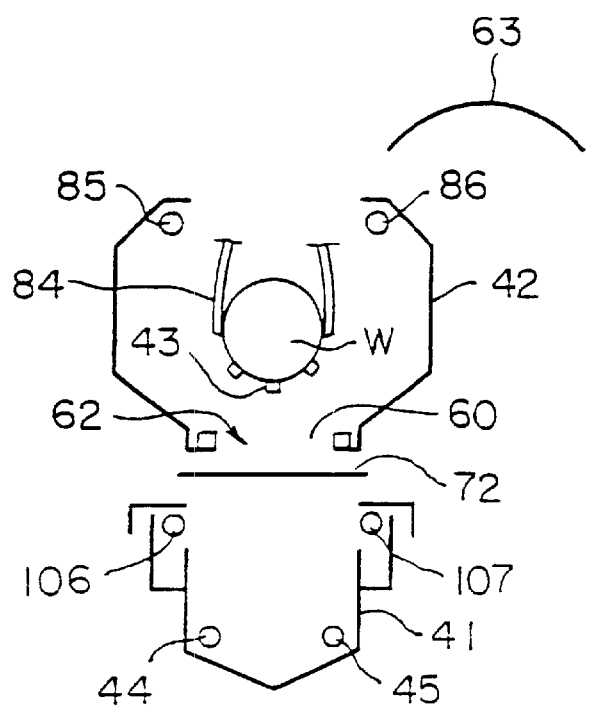
F I G. 18
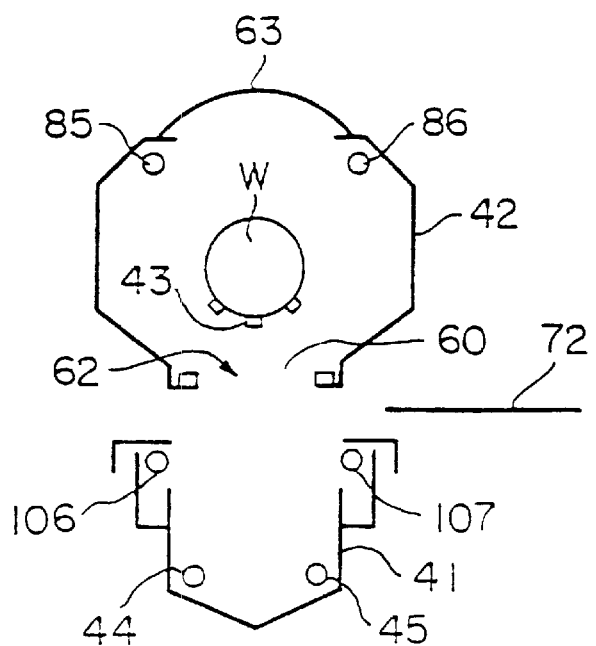
F I G. 19

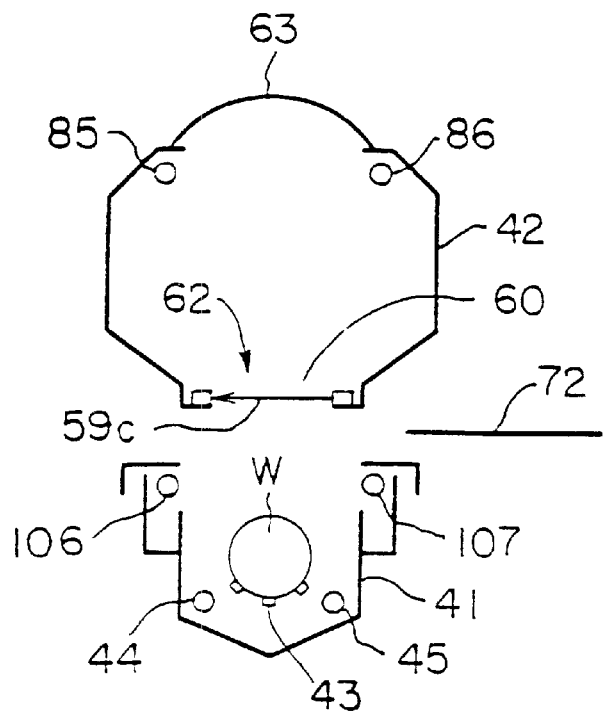
F I G. 21
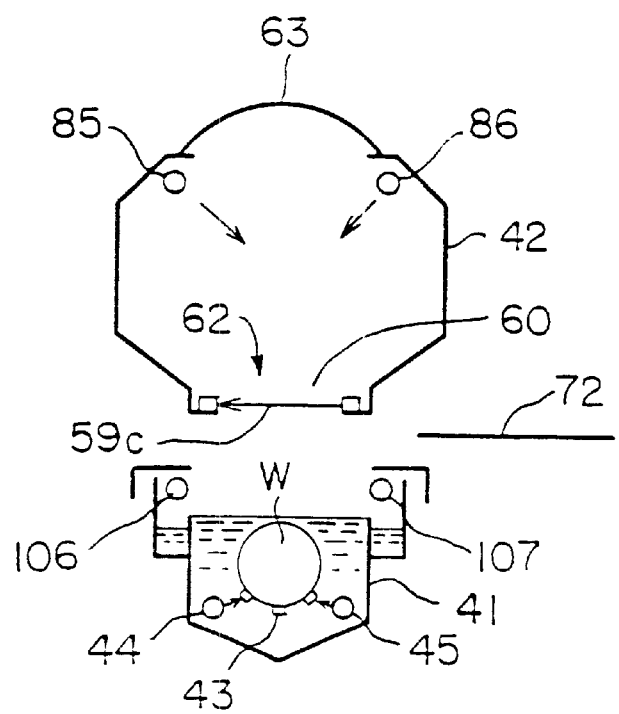
F I G. 22

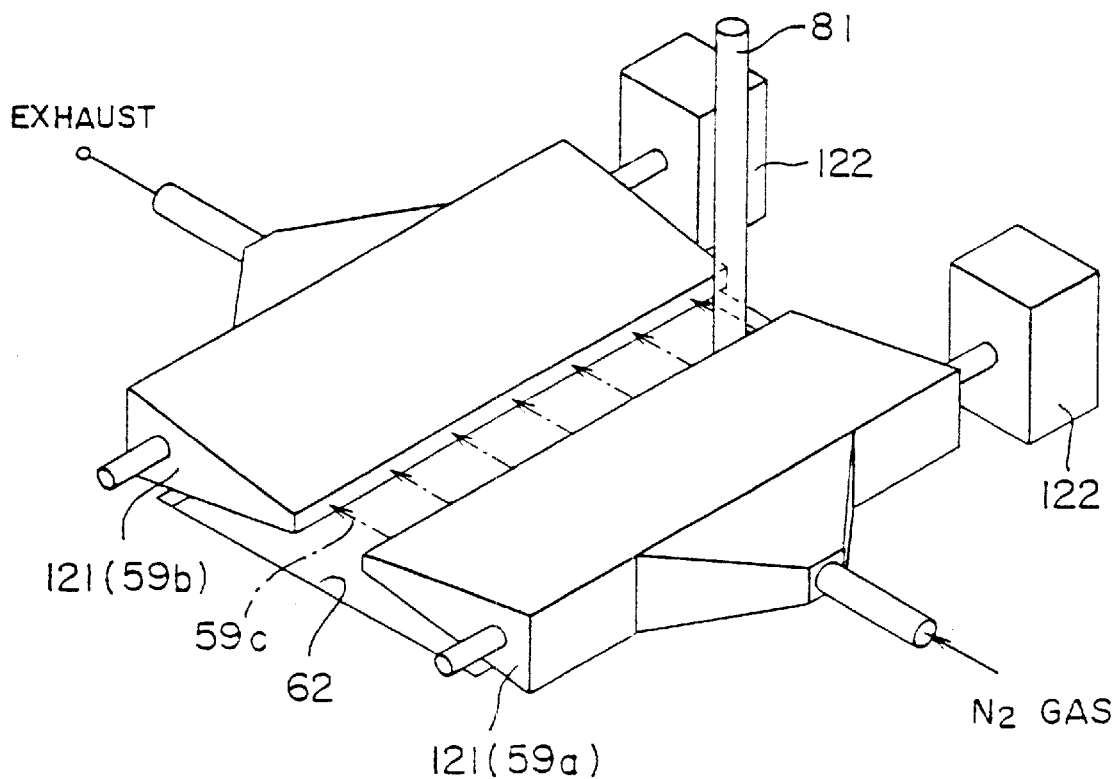
F I G. 31

APPARATUS FOR AND METHOD OF CLEANING OBJECT TO BE PROCESSED

The present application is a continuation of Ser. No. 09/432,422, filed Nov. 2, 1999, now U.S. Pat. No. 6,319,329, which is a divisional of U.S. Ser. No. 09/010,851, filed on Jan. 22, 1998, now U.S. Pat. No. 6,131,588, which prior application is incorporated herein by reference.

BACKGROUND OF THE INVENTION

The present invention relates to a cleaning apparatus and a cleaning method, by which objects to be processed, such as semiconductor wafers and glass substrates for a LCD (liquid crystal display) unit etc., are immersed and cleaned in chemical and subsequently dried.

For example, in a cleaning treatment of a manufacturing process for a semiconductor device, such as LSI etc., various cleaning apparatuses are employed for removing contaminants on the surfaces of the semiconductor wafers, such as particles, organic contaminants, metallic impurities and so on, and for etching the surface of the wafer. Note, in this specification, the semiconductor wafer(s) will be called the wafer(s) for short, hereinafter. Above all, a cleaning apparatus of "wet" type comes into wide use on the grounds that the above contaminants can be removed effectively, the etching can be done and a batch processing can be accomplished to enhance the throughput in the cleaning process.

In such a wet type of cleaning apparatus, the wafers to be cleaned are subjected to a chemical cleaning process (e.g. ammonia treatment, hydrogen fluoride treatment, sulfuric acid treatment etc.), a washing cleaning process using pure water etc., and a drying process using isopropyl alcohol $[(CH_3)_2CHOH]$ or the like. Note, the isopropyl alcohol will be referred the IPA, hereinafter. Further, the cleaning apparatus is so constructed to supply the chemicals, the pure water and the IPA to processing baths in processing order and a drying room, respectively. Thus, with the above arrangement, a batch processing method where the wafer in blocks of e.g. 50 sheets are successively immersed in the processing baths and dried in the drying room, comes into wide use.

However, the provision of the processing baths and the drying room for each process causes the apparatus to be large-sized undesirably. In addition, because of a lot of opportunities for transporting the wafers in the apparatus, in other words, being exposed to atmosphere, there is a great possibility of the particles' sticking to the wafers.

Therefore, in e.g. Japanese Unexamined Patent Publication (kokai) No. 64-81230 and the same No. 6-326073 etc., there are proposed cleaning apparatuses in each of which the processing baths and the drying room are formed in one body, so that the above-mentioned chemical process and drying process are carried out in one chamber. FIG. 1 shows one example of the cleaning apparatuses in the publications, representatively.

The shown cleaning apparatus comprises a chamber 200 and chemical (liquid) 202 stored in a lower portion 201 of the chamber 200. In processing, a wafer W is firstly immersed in the chemical 202. Thereafter, the wafer W is pulled up from the chemical 202 and then subjected to the drying process using the IPA etc. at an upper portion 203 of the chamber 200.

In the above-mentioned drying process while heating, however, there is a possibility that chemical atmosphere remaining in an upper area of the chamber 200 exerts a bad influence on the wafer W during the drying process.

Furthermore, since there is a need to meet respective requirements of the chemical and drying processes simultaneously, the degree of freedom is restricted in design of the cleaning apparatus. Therefore, it is difficult to adopt various ideas to realize a high-speed cleaning process, a miniaturization of the chamber and so on. Meanwhile, in the drying process using the above IPA etc., it is generally executed to decompress the chamber by using a vacuum pump or the like. However, since the chamber in the cleaning apparatus constructed above, in which the chemical treatment etc. and the sequent drying process are executed together, has to have a large capacity volume to a certain extent, there are problems to be solved that it is necessary to increase a wall thickness of the chamber in order to ensure the pressure tightness and a high power vacuum pump is also required.

SUMMARY OF THE INVENTION

Accordingly, it is therefore an object of the present invention to provide a cleaning apparatus and a cleaning method, by which an object to be processed is not subjected to a bad influence from the chemical process during the drying process.

It is the other object of the present invention to provide a cleaning apparatus which has a high degree of freedom in design thereby to clean the objects rapidly and miniaturize the apparatus itself, and a cleaning method realized by using the cleaning apparatus.

It is the further object of the present invention to provide a cleaning apparatus which is capable of reducing a capacity of the chamber thereby to decrease a wall thickness of the chamber and an output required for the vacuum pump, and a cleaning method realized by using the cleaning apparatus.

It is the other object of the present invention to provide a cleaning apparatus and a cleaning method, by which it is possible to execute the drying process more effectively.

It is the other object of the present invention to provide a cleaning apparatus which is capable of preventing an occurrence of water marks on surfaces of the object.

It is the other object of the present invention to provide a cleaning apparatus in which a processing bath and a drying section are separated from each other thereby to prevent mist etc. of treatment liquids from entering into a drying chamber thereby to accomplish a stable drying performance of the apparatus, and a cleaning method realized by using the cleaning apparatus.

As a first feature of the present invention, the above-mentioned mentioned objects described above can be accomplished by a cleaning apparatus for cleaning an object to be processed, the apparatus comprising:

a processing bath for storing processing liquid in which the object is immersed;

a drying chamber arranged above the processing bath and provided with an opening which is disposed between a body of the drying chamber and the processing bath and through which the object is transported, the opening being capable of closing;

transporting means for transporting the object between the processing bath and the drying chamber through the opening;

introducing means for introducing inert gas into the drying chamber in order to prevent an atmosphere in the processing bath from moving to the drying chamber; and filling means for filling the drying chamber with an atmosphere of organic solvent.

As a second feature of the present invention, the above-mentioned objects described above can be also accomplished by a cleaning apparatus for cleaning an object to be processed, the apparatus comprising:

a processing bath for storing processing liquid in which the object is immersed;

a drying chamber arranged above the processing bath and provided with an opening which is disposed between a body of the drying chamber and the processing bath and through which the object is transported, the opening being capable of closing;

transporting means for transporting the object between the processing bath and the drying chamber through the opening;

screening means for screening the opening by a current of inert gas; and filling means for filling the drying chamber with an atmosphere of organic solvent.

As a third feature or the present invention, the above-mentioned objects described above can be also accomplished by a cleaning apparatus for cleaning an object to be processed, the apparatus comprising:

a processing bath for storing processing liquid in which the object is immersed;

a drying chamber arranged above the processing bath and provided with an opening which is disposed between a body of the drying chamber and the processing bath and through which the object is transported, the opening being capable of closing;

transporting means for transporting the object between the processing bath and the drying chamber through the opening;

filling means for filling the drying chamber with an atmosphere of organic solvent; and screening means for screening the opening by a current of inert gas;

wherein the screening means includes a pair of first and second doors arranged so as to open and close the opening, the first door having a leading end formed to oppose the second door and provided with an exhaust port for discharging inert gas, the second door having a leading end formed to oppose the first door and provided with an intake port for the inert gas, whereby a current of the inert gas is formed between the leading end of the first door and the leading end of the second door, for screening the opening since the inert gas discharged from the exhaust port of the first door is sucked through the intake port of the second door, in a closing state of the first and second doors.

A fourth feature of the present invention resides in the cleaning apparatus in accordance with any one of the first feature to the third feature, further comprising open and shut means for opening and shutting the opening, alternatively.

A fifth feature of the present invention resides in the cleaning apparatus in accordance with any one of the first feature to the third feature, further comprises open and shut means for alternatively opening and shutting the opening, the first open and shut means in a shutting state thereof also sealing the drying member of the first open and shut means.

A sixth feature of the present invention resides in the cleaning apparatus in accordance with the fifth feature, wherein the filling means includes a nozzle for ejecting gas containing the organic solvent into the drying chamber, the nozzle consisting of at least two inside and outside pipes of different diameters, which engage with each other so that respective circumferential faces thereof are apart from each other; and wherein the inside pipe is provided, in an axial direction thereof, with a plurality of gas outlets at intervals of a predetermined distance, while the outside pipe is provided, in an axial direction thereof, with a plurality of gas outlets at intervals of a length shorter than the predetermined distance.

As a seventh feature of the present invention, the above objects can be also accomplished by a cleaning method of cleaning an object to be processed, the cleaning method comprising the steps of:

(a) transporting the object before processing from a drying chamber into a processing bath through a lower opening formed in the drying chamber while retaining the object by a retaining member carried on the drying chamber'side;

(b) storing processing liquid in the processing bath before or after transporting the object before processing from drying chamber into the processing bath and subsequently immersing the object in the processing liquid;

(c) transporting the object after processing from the processing bath into the drying chamber; and (d) filling the drying chamber with an atmosphere of organic solvent and drying the object after processing in the drying chamber.

An eighth feature of the present invention resides in the cleaning method in accordance with the seventh feature, further comprising a step of closing the opening after transporting the object after processing to the drying chamber.

A ninth feature of the present invention resides in the cleaning method in accordance with the seventh or eighth feature, further comprising a step of replacing an atmosphere in the drying chamber with inert gas, before bringing the object before processing from outside into the drying chamber.

A tenth feature of the present invention resides in the cleaning method in accordance with the seventh or eighth feature, further comprising a step of replacing an atmosphere in the drying chamber with inert gas while exhausting an atmosphere in the drying chamber, before bringing the object before processing from outside into the drying chamber.

An eleventh feature of the present invention resides in the cleaning method in accordance with the seventh or eighth feature, further comprising a step of replacing an atmosphere in the drying chamber with inert gas while exhausting an atmosphere in the drying chamber, before filling the drying chamber with the atmosphere of organic solvent.

A twelfth feature of the present invention resides in the cleaning method in accordance with the seventh or eighth feature, after executing the step (d), further comprising a step of introducing inert gas into the drying chamber for recovering the drying chamber of an atmospheric pressure while decompressing the drying chamber, wherein the supply of inert gas during the recover of the drying chamber of an atmospheric pressure is controlled so that a supply volume of the inert gas per unit time increases as time passes.

A thirteenth feature of the present invention resides in the cleaning method in accordance with the seventh or eighth feature, wherein the step (b) comprises the steps of:

executing chemical cleaning of the object;

executing water cleaning of the object; and executing ozone cleaning of the object after the water cleaning.

A fourteenth feature of the present invention resides in the cleaning method in accordance with the thirteenth feature, wherein the step (b) further comprises a step of executing additional water cleaning of the object after the ozone cleaning.

According to the first feature of the invention, owing to the current of inert gas directing from the drying chamber toward the opening, it is possible to prevent the entering of chemicals from the processing bath to the drying chamber. Further, since the forthcoming process in the next processing bath can be prepared while the drying process is executed, it is possible to improve throughput of the cleaning apparatus. Additionally, since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the above-mentioned arrangement allows the volume of the drying chamber to be reduced, it is possible to reduce the wall thickness of the drying chamber and the processing bath when it is required to decompress the drying chamber while filling up with the atmosphere of the organic solvent. In addition, it is possible to make the decompression with the low-powered vacuum pump.

According to the second feature to the fourth feature of the invention, owing to the provision of the screening means for screening the opening by the current layer of inert gas, it is possible to screen the processing bath from the drying chamber at the chemical processing for the object, so that the entering of chemicals from the processing bath to the drying chamber can be prevented.

According to the third feature of the invention, when closing the opening by the first and second doors, the clearance between the first and second doors can be screened by the flow of inert gas. Accordingly, it is possible to prevent an invasion of the chemical atmosphere from the processing bath to the drying chamber, furthermore.

According to the fourth feature of the invention, by the open and shut means for opening and shutting the opening of the drying chamber, it is possible to screen the drying chamber from the processing bath at the time of drying the object, so that the object during the drying process is hardly subjected to bad influences derived from the chemicals in the processing bath.

According to the fifth feature of the invention, by separating the drying member from the processing bath in a leak-tight manner at the time of drying the object, the object during the drying process is not subjected to the bad influences derived from the chemicals in the processing bath.

Meanwhile, if gas is introduced into a pipe through an end thereof and then ejected into the drying chamber through gas outlets provided along an axial direction of the pipe, there would be caused a tendency that the closer the gas outlet approaches the other end of the pipe, the less a volume of gas ejected from the gas outlet becomes. Further, in case of ejecting heated gas, there is a tendency that the closer the gas outlet approaches the other end of the pipe, the lower a temperature of gas ejected from the gas outlet gets. According to the sixth feature of the invention, since respective gas flows ejected through a small number of gas outlets on the inside pipe are once joined in a space defined between the inside pipe and the outside pipe and then supplied into the drying chamber through the gas outlets on the outside pipe, it is possible to reduce the differences in volume and temperature of the ejected gas among the gas outlets furthermore.

According to the cleaning method as the seventh feature of the invention, since the drying chamber is separated from the processing bath, the forthcoming process in the next processing bath can be prepared while the drying process is executed, so that the throughput of the cleaning apparatus can be improved. Additionally, since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the above-mentioned arrangement allows the volume of the drying chamber to be reduced, it is possible to reduce the wall thickness of the drying chamber and the processing bath when it is required to decompress the drying chamber while filling up with the atmosphere of the organic solvent. In addition, it is possible to make the decompression with the low-powered vacuum pump.

According to the eighth feature of the invention, it is possible to screen the drying chamber from the processing bath at the time of drying the object, so that the object during the drying process is hardly subjected to bad influences derived from the chemicals in the processing bath.

According to the ninth feature of the invention, if only the atmosphere of the drying chamber is replaced with predetermined inert gas prior to the loading of the object into the drying chamber, it is possible to lighten contact between oxygen and the object during its movement from the preceding process chamber up to the present cleaning apparatus and to restrict the natural growth of an oxide film. Moreover, as the replacement of inert gas to be executed again during the cleaning of the object can be started from a state having a lower oxygen concentration than that of the air outside, it is possible to shorten time required for lowering the concentration of oxygen to its permissible value remarkably.

According to the tenth and eleventh features of the invention, by supplying the inert gas in the drying chamber while exhausting it, it is possible to enhance an efficiency in replacing the atmosphere in the drying chamber with the inert gas.

According to the twelfth feature of the invention, it is possible to prevent particles on the inner wall of the drying chamber from flying up by the inert gas flows introduced thereinto and sticking on the object after cleaning or drying.

According to the thirteenth feature of the invention, by applying the ozone cleaning for forming a thin oxide film on the object after its chemical and water cleaning, it is possible to prevent an occurrence of water marks on a surface of the object.

The above and other features and advantages of this invention will become apparent, and the invention itself will best be understood, from a study of the following description and appended claims, with reference had to the attached drawings showing a preferred embodiment of the invention.

BRIEF DESCRIPTION OF THE DRAWINGS

FIG. 12 is a perspective view showing a wafer guide of the cleaning unit of FIG. 4;

FIG. 18 is a schematic view showing the operation of the cleaning unit of FIG. 4, corresponding to a step 1403 of FIG. 15;

FIG. 19 is a schematic view showing the operation of the cleaning unit of FIG. 4, corresponding to a step 1404 of FIG. 15;

FIG. 21 is a schematic view showing the operations of the cleaning unit of FIG. 4, corresponding to a step 1406 of FIG. 15;

FIG. 22 is a schematic view showing the operation of the cleaning unit of FIG. 4, corresponding to steps 1407 to 1411 of FIG. 15;

FIG. 31 is a perspective view of a modification of the nitrogen gas curtain screening arrangement of FIG. 9.

DESCRIPTION OF THE PREFERRED EMBODIMENT

One embodiment of the present invention will be described with reference to drawings.

Figure 1:
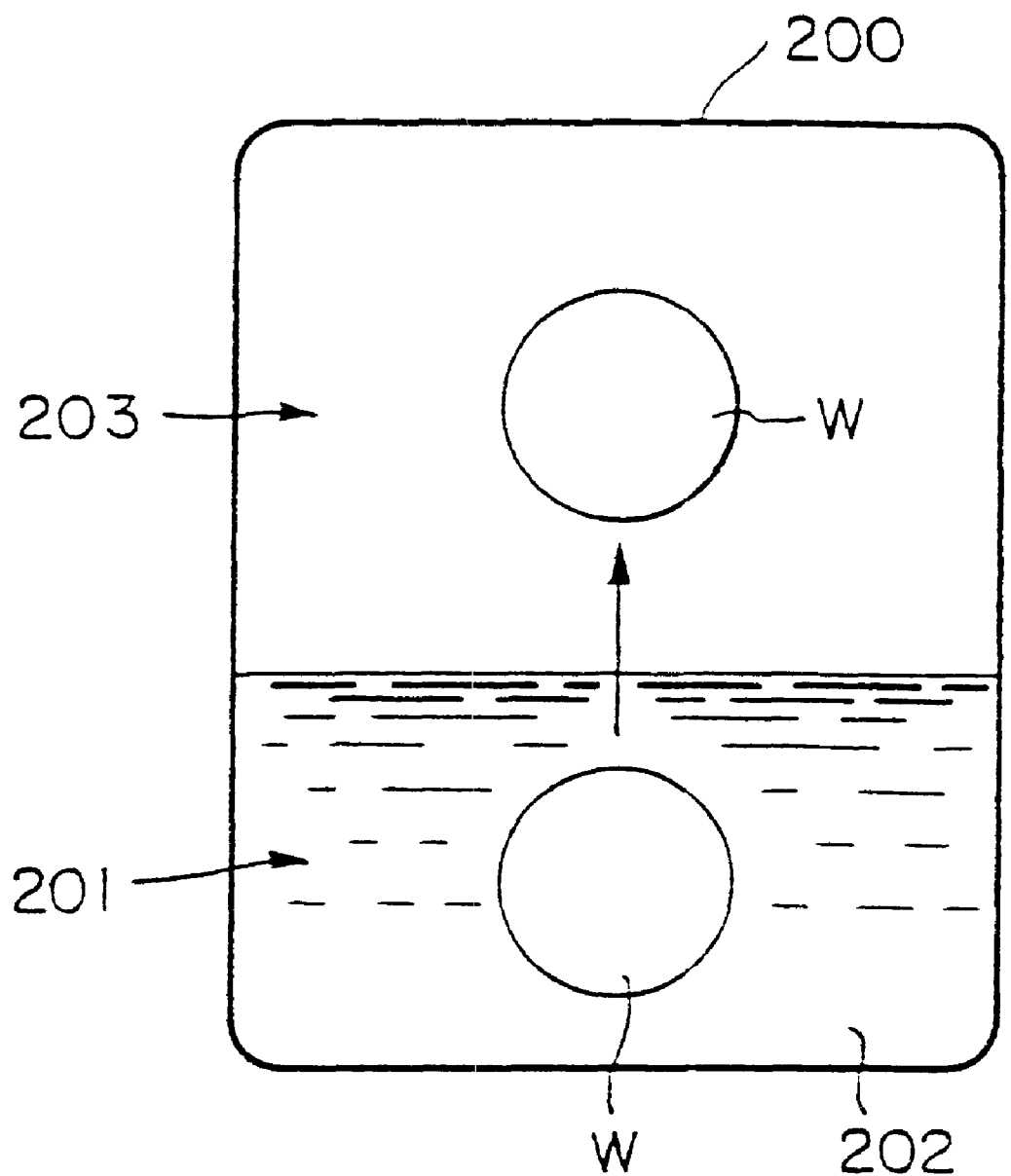
FIG. 1 is a schematic view of a conventional cleaning apparatus.
Figure 2:
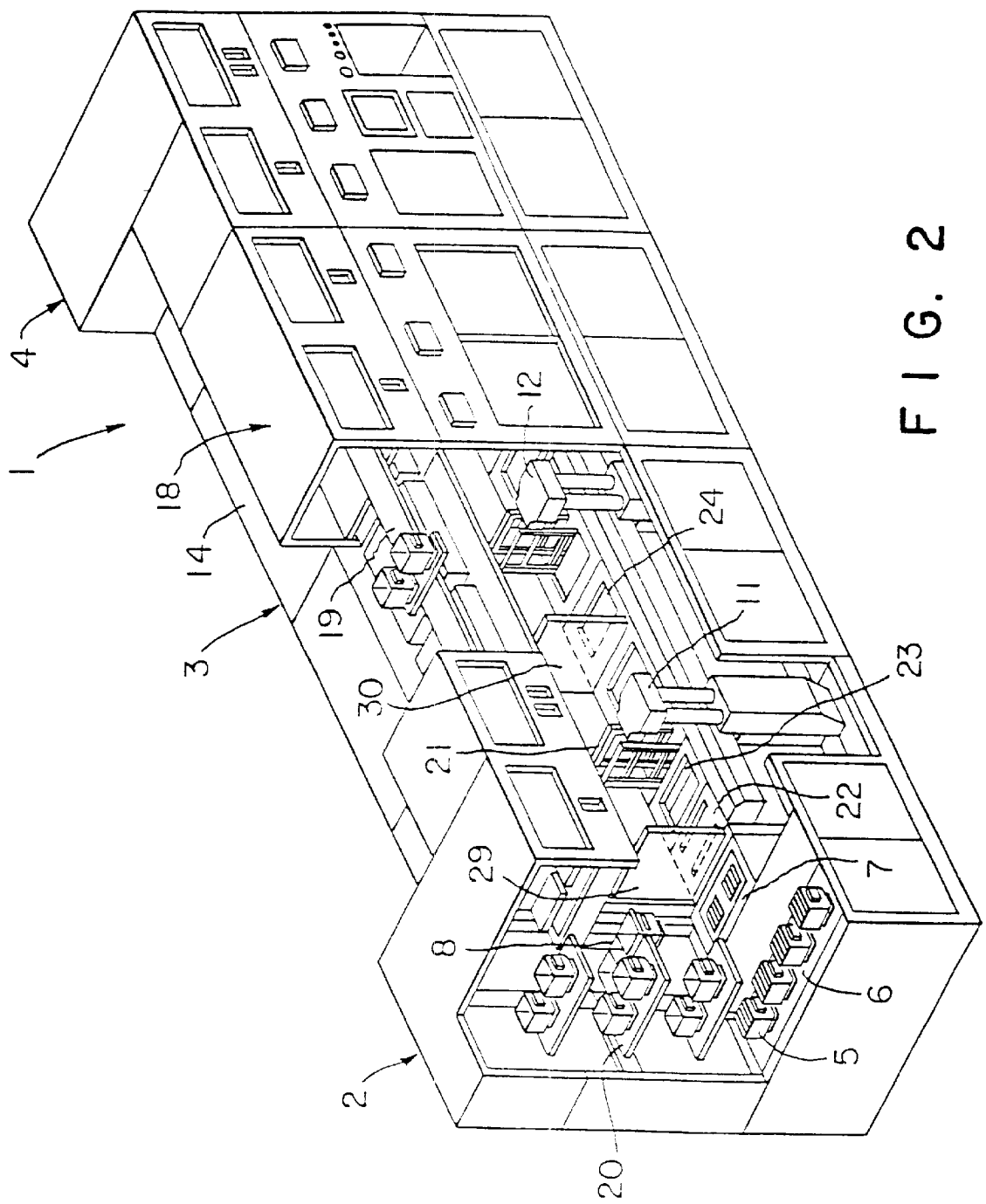
FIG. 2 is a perspective view of a cleaning apparatus for semiconductor wafers, in accordance with one embodiment of the present invention.
Figure 3:
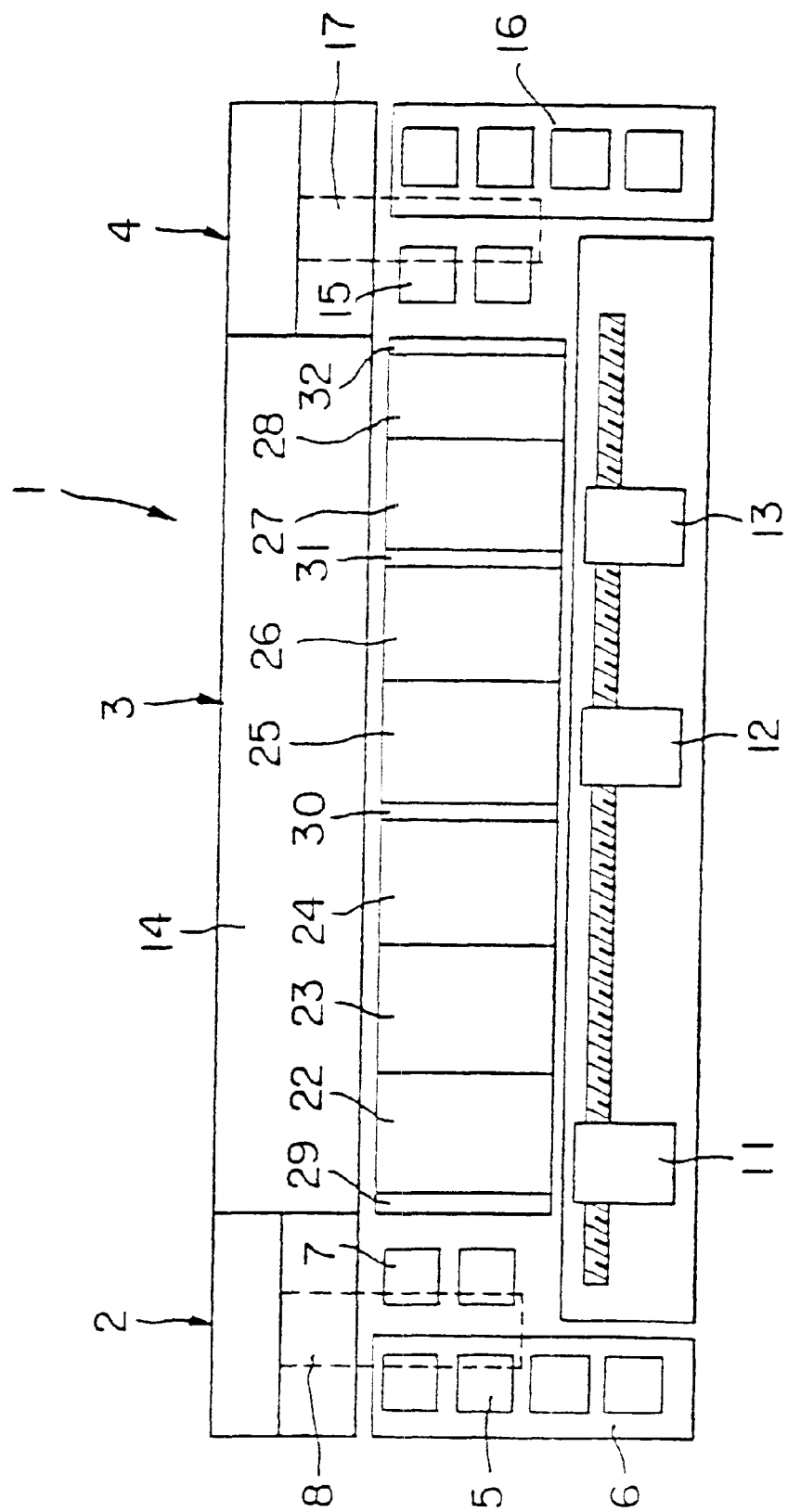
FIG. 3 is a plan view of the cleaning apparatus of FIG. 2.

First of all, we now describe a cleaning apparatus for cleaning semiconductor wafers, as an example to which the invention is applied. Note, through the description, the semiconductor wafer(s) will be also referred as "wafer(s)", hereinafter. As shown in FIGS. 2 and 3, the whole cleaning apparatus 1 comprises a loading section 2 for accommodating the wafers before cleaning in blocks of carriers, a cleaning section 3 for cleaning the wafers, and an unloading section 4 for picking up the wafers after cleaning and dried in the section 3 into the carriers C every predetermined number of in blocks of cassettes. Thus, the cleaning apparatus 1 of the embodiment is constituted by three processing zones.

Arranged in the loading section 2 are a transporting stand-by part 6 which causes carriers 5 having predetermined number (e.g. twenty-five sheets) of precleaning wafers accommodated therein to be transported thereinto and stand by and a loader part 7 which carries out a picking-up operation of the wafers from the carriers 5, an aligning operation of respective orientation flats of the wafers, and a counting operation for the number of wafers. Further, the loading section 2 is provided with a transfer arm 8 which transports the carriers 5, which have been loaded from the outside by a transporting robot etc., to the transporting stand-by part 6 and also between the transporting stand-by part 6 and the loader part 7.

In the cleaning section 3, three wafer transfer units 11, 12, 13 are arranged on the front side (this side in FIG. 2) of the section 3, while a piping area 14 is defined on the back side of the section 3 through partition walls, for housing various tanks for reserving processing liquids, such as chemicals, and various pipes.

On the other hand, the unloading section 4 includes an unloader part 15 for accommodating the wafers cleaned in the cleaning section 3 in the carriers 5, a transporting stand-by part 16 for causing the carriers 5 with the wafers to stand by and be transported therefrom and a transfer arm 17 for transporting the carriers 5 between the unloader part 15 and the transporting stand-by part 16.

Note, the cleaning apparatus 1 further includes a carrier transfer section 18 which transports the carriers 5 emptied in the loading section 2. The carrier transfer section 18 is equipped with a carrier conveyer 19 arranged above the cleaning section 3, a carrier stock section 20 for receiving the emptied carriers 5 from the loader part 7 of the loading section 2 by means of the transfer arm 8 and stocking the carriers 5 with and without the wafers, and a not-shown delivering part which receives the emptied carriers 5 from the carrier conveyer 19 by means of the transfer arm 17 at the unloading section 4 and delivers the emptied carriers 5 to the unloader part 15.

The cleaning section 3 is provided with the following baths in order from the side of the loader part 7: a chuck cleaning/drying bath 22 for cleaning and drying a wafer chuck 21 of the wafer transfer unit 11; a chemical cleaning bath 23 for removing impurities, such as organic contaminants, metallic impurities particles or the like, on the surface of the wafer by using the chemicals, such as ammonium hydrogen peroxide ($NH_4/H_2O_2/H_2O$); a wash cleaning bath 24 for cleaning the wafers cleaned in the bath 23 by e.g. pure water; a chemical cleaning bath 25 for removing metallic contaminations on the wafers by a chemical, such as a mixture of $HCl/H_2O_2/H_2O$; a wash cleaning bath 26 for cleaning the wafers cleaned in the bath 25 by e.g. pure water; and a cleaning unit 27 of the invention for removing an oxide on the wafers by a chemical (e.g. a mixture of $HF/H_2O$), cleaning the washed wafers by the rinse (e.g. pure water) and drying the cleaned wafers; and a chuck cleaning and drying bath 28 for cleaning and drying not-shown wafer chucks of the wafer transfer unit 13.

Note, partition plates 29, 30, 31, 32 are interposed between the loader part 7 and the chuck cleaning/drying bath 22, between the wash cleaning bath 24 and the chemical cleaning bath 25, between the wash cleaning bath 26 and the cleaning unit 27, and between the chuck cleaning and drying bath 28 and the unloader part 15, respectively. These partition plates 29, 30, 31, 32 are adapted so as to open upward and shut downward in receiving and delivering the wafers by driving mechanisms which are not shown in the figures. Owing to the provision of the partition plates 29, 30, 31, 32, it is possible to prevent atmosphere of the chemicals from diffusing into the adjoining spaces.

We now describe structure of the cleaning unit 27 with reference to FIGS. 4 to 14. The cleaning unit 27 includes a cleaning bath 41 as a processing bath reserving the processing liquids of chemicals (e.g. mixture of $HF/H_2O$) and the rinse (e.g. pure water) and immersing the wafers to be processed in the liquids, and a cylindrical drying chamber 42 arranged above the cleaning bath 41 to drying the wafers W transported from the cleaning bath 41.

The cleaning bath 41 accommodates a wafer guide 43 and e.g. fifty sheets of wafers W carried by the wafer guide 43. Further, the cleaning bath 41 is provided, on both sides of a bottom thereof, with nozzles 44, 45 for ejecting the processing liquid for the wafers W accommodated therein. The nozzles 44, 45 may be constituted by pipes each of which has respective injection orifices formed at each interval equal to a distance between the adjoining wafers W along the direction of the wafers' arrangement. Into the nozzles 44, 45, any one of rinsing liquids; such as chemical (e.g. mixture of $HF/H_2O$), ozone water, pure water (DIW: deionized water) etc., is supplied from the piping area 14 shown in FIGS. 2 and 3 by switching operations of switching valves 46a, 46b. The switching operations of the switching valves 46a, 46b are controlled by a not-shown controller at predetermined timing. Note, in order to prevent the oxidation of the wafers W, it is preferable to use the deaerated DIW as the rinsing liquid.

Additionally, in the circumference of the cleaning bath 41, a collect bath 47 is provided for collecting the processing liquid overflowing the cleaning bath 41. The processing liquid collected by the collect bath 47 is adapted so as to circulate in the nozzles 44, 45 through a switching valve 48, a pump 49, a filter 50 and a switching valve 51. In the switching valve 48, it is changed whether to circulate the processing liquid collected by the collect bath 47 in the above-mentioned manner or to discharge the liquid. In the switching valve 51, it is changed whether to circulate the processing liquid collected by the collect bath 47 or to supply the DIW to the nozzles 44, 45, which has been cooled to the 0—a normal temperature (° C.) degree range, more preferably 5 ° C., by a cooler. Note, a damper 52 is disposed between the pump 49 and the filter 50. At the lowermost of the cleaning bath 41, an exhaust port 53 is arranged to drain the processing liquid. In the switching valve 54, it is changed whether to drain the processing liquid through the exhaust port 53 or not.

While, the drying chamber 42 is provided, on upper and lower parts thereof, with rectangular upper and lower openings 61, 62 for receiving and delivering the wafers W, respectively. A closed lid 63 is laid on the upper opening 61, while a nitrogen-gas curtain screening arrangement 60 and a slide door arrangement 64 are provided at the lower opening 62.

Figure 6:
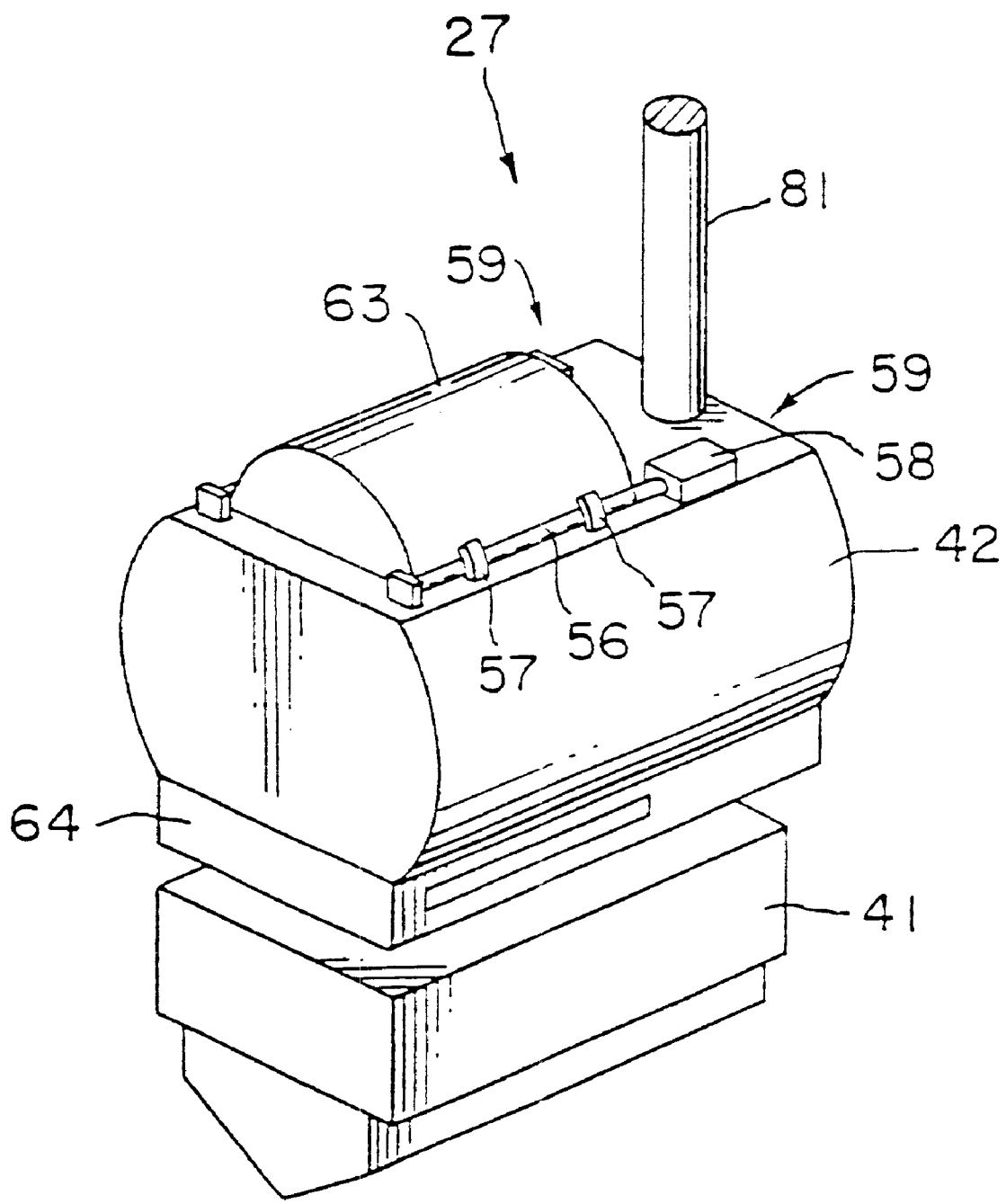
FIG. 6 is a perspective view of the cleaning unit of FIG. 4.
Figure 7:
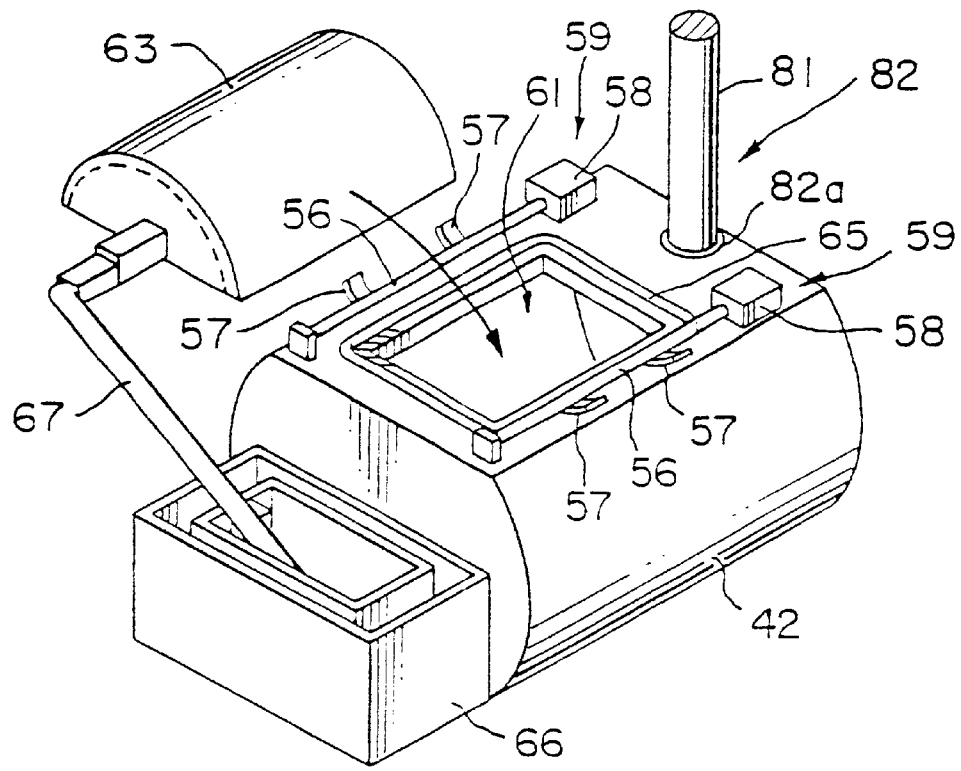
FIG. 7 is a perspective view showing the vicinity of an upper lid of the cleaning unit of FIG. 4.

The lid 63 is made of resin, such as PVC (polyvinyl chloride) and PP (polypropylene) etc., and shaped like a semi-cylinder at both of the interior and exterior, as shown in FIG. 6. Thus, such a formation of the lid 63 allows the interior of the drying chamber 42 closed by the lid 63 to be formed cylindrically, while preventing a stream of nitrogen gas etc. blown against the wafers W from being turbulent. Consequently, the nitrogen gas or the like can be blown against the respective wafers W uniformly. Additionally, as shown in FIG. 7, an O-ring 65 is arranged around the periphery of the upper opening 61 and furthermore, a pair of lid fixing mechanisms 59 are disposed on both sides of the upper opening 61, for depressing the lid 63 closing the upper opening 61 securely. With such an arrangement, it is possible to enhance the sealing capability of the chamber 41 under condition that the upper opening 61 is closed by the lid 63. Provided at two positions of each rotatable rod 56 of the fixing mechanism 59 are junction plates 57 which are engageable with the lid 63 closing the upper opening 61. In operation, when respective rotary driving units 58 operate to rotate the rods 56 respectively, the junction plates 57 are brought into contact with the lid 63, so that it is urged against the periphery of the opening 61 firmly.

Figure 8:
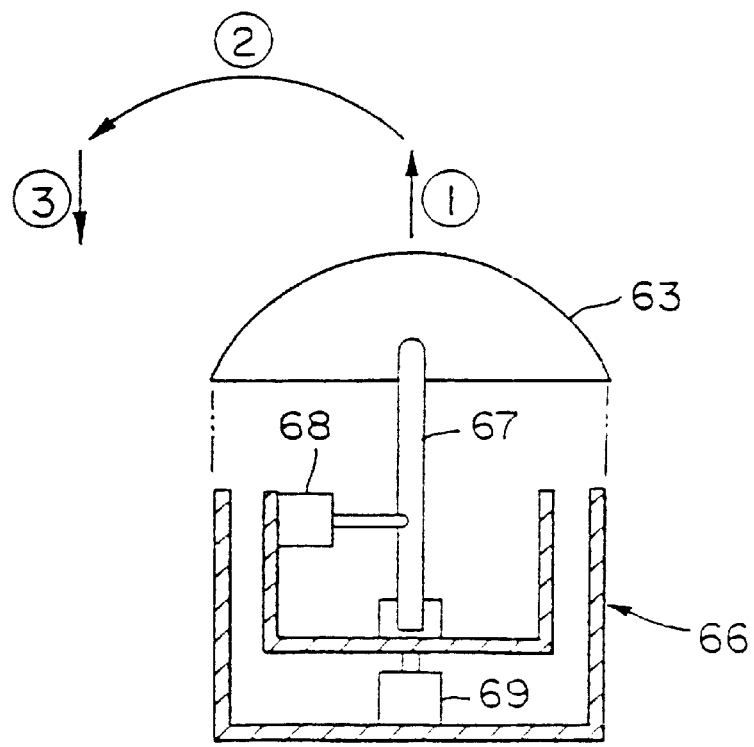
FIG. 8 is a view showing a schematic structure of a lid driving section of the cleaning unit of FIG. 4.

Arranged in the vicinity of the drying chamber 42 is a lid actuator 66 which drives to open and shut the lid 63. As shown in FIG. 8, the lid actuator 66 includes a cylinder 68 for rotating a pivot arm 67 having an end fixed to the lid 63, and another cylinder 69 for moving the lid 63 and these rotating arrangement (the cylinder 68, the arm 67) upward and downward. In operation for opening the lid 63, the lid actuator 66 firstly moves the lid 63 closing the upper opening 61 upward (see ① of FIG. 8). Subsequently, the lid actuator 66 further rotates the lid 63 to a position apart from the upper opening 61 (see ② of FIG. 8) and moves the lid 63 downward (see ③ of FIG. 8). In this way, the upper opening 51 is opened. On the contrary; when it is required to close the upper opening 61 by the lid 63, the above-mentioned operations will be executed in reverse order (i.e. ③Δ②Δ① of FIG. 8).

Figure 9:
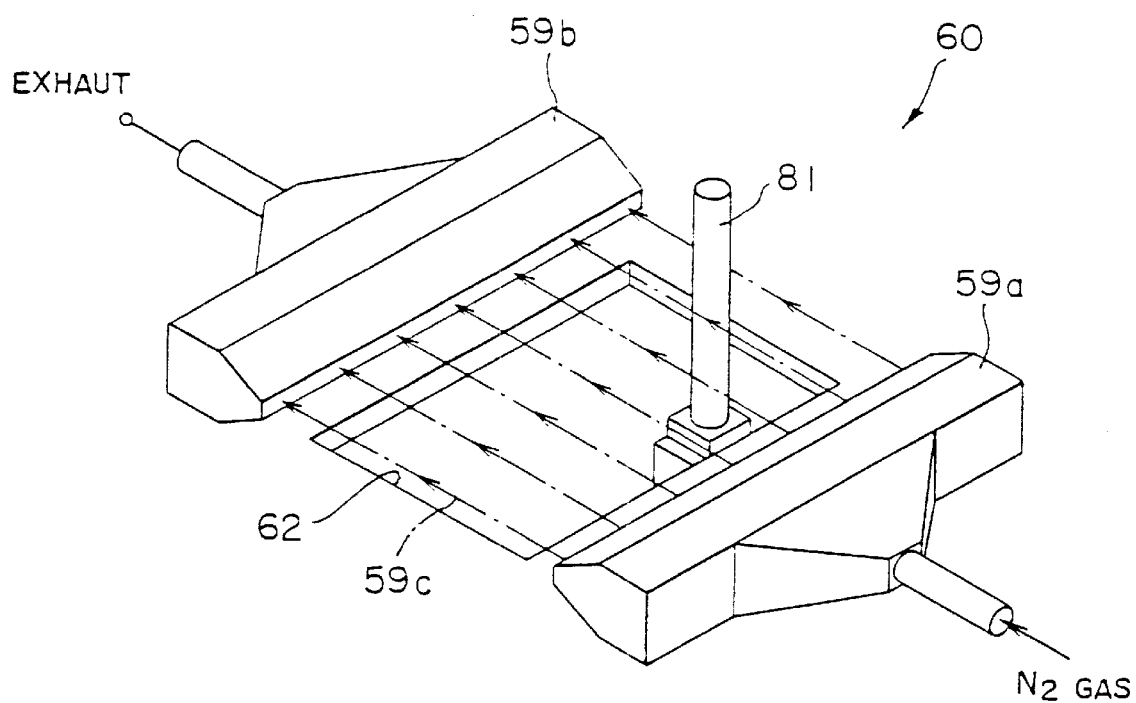
FIG. 9 is a perspective view showing a nitrogen gas curtain screening arrangement of the cleaning unit of FIG. 4.

As shown in FIG. 9, the nitrogen-gas curtain screening arrangement 60 comprises a nitrogen-gas exhaust part 59a and a nitrogen-gas intake part 59b which are opposed to each other on both left and right ends of the opening 62 of the drying chamber 42. Thus, owing to the provision of the parts 59a, 59b, the arrangement 60 is adapted so as to form a current layer 59c of nitrogen gas in order to screen the opening 62. Note, in the specification, the current layer 59c will be also referred as "nitrogen-gas curtain 59c", hereinafter.

Figure 10:
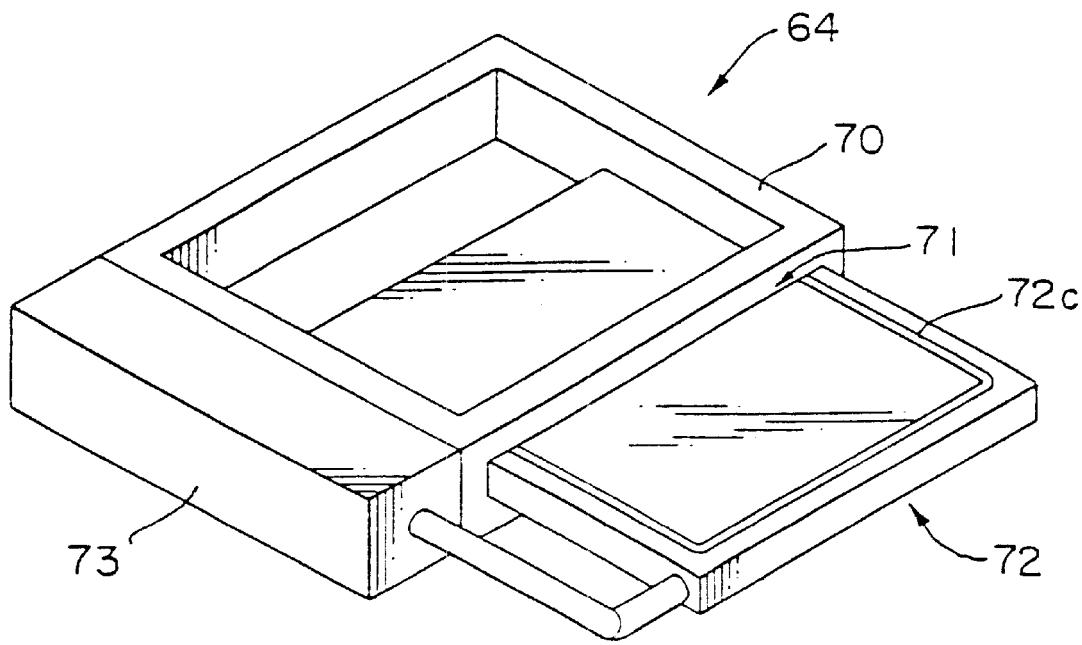
FIG. 10 is a perspective view showing a slide door arrangement of the cleaning unit of FIG. 4.
Figure 11:
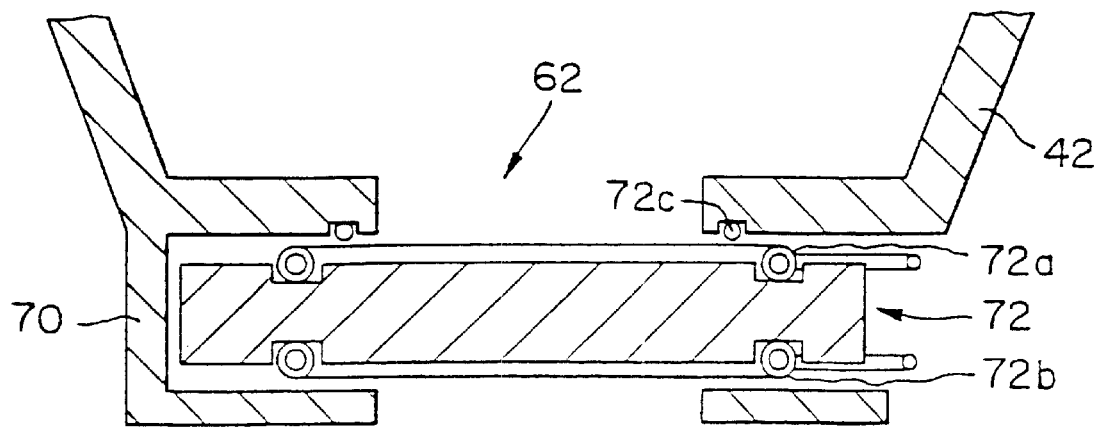
FIG. 11 is a longitudinal cross sectional view showing the slide door arrangement of FIG. 10.

As shown in FIG. 10, the slide door arrangement 64 comprises a rectangular flange 70 disposed between the cleaning bath 41 and the drying chamber 42, a slide door 72 inserted into an opening 71 formed in the flange 70 to open and close an interior of the flange 70, and a cylinder 73 for driving the slide door 72. Similar to the lid 63, the slide door 72 is made of resin, such as PVC (polyvinyl chloride) and PP (polypropylene) etc., and rectangular-shaped similarly to the lower opening 62. Further, as shown in FIG. 11, respective air grip seals 72a, 72b are arranged along outer peripheries on both sides of the slide door 72, while an O-ring 72c is arranged on a bottom face of the drying chamber 42 so as to extend along an inner side of the air grip seal 72a. In the modification, the O-ring 72c may be arranged along an outside of the air grip seal 72a. In operation, under condition that the slide door 72 is accommodated in the flange 70, both air grip seals 72a, 72b are inflated so as to come into tight contact with the bottom face of the drying chamber 42 and a bottom face of the flange 70, respectively. Subsequently, the O-ring 72c is brought into contact with the surface of the slide door 72 tightly. In this way, the lower opening 62 is closed tightly.

As shown in FIG. 12, the wafer guide 43 is provided, at an lower end of the carrying member 74 thereof, with a wafer support 75 for supporting a plurality of wafers W (e.g. 50 sheets). The wafer support 75 consists of an intermediate supporting rod 76 and two lateral supporting rods 77, 78 arranged in parallel with each other on both sides of the rod 76. Respective ends of the rods 76, 77, 78 are fixed with a lower end of the carrying member 74, while the other ends of the rods 76, 77, 78 are secured to a fixing member 79. Each of the rods 76, 77, 78 has a plurality of retaining grooves 80, 80, . . . , 80 (e.g. fifty grooves) formed at predetermined intervals in the longitudinal direction. The wafer guide 43 is made of materials exhibiting superior characteristics in corrosion resistance, heat resistance and durability, for example, PEEK (polyether ether ketone), Qz (quartz) and so on.

Figure 5:
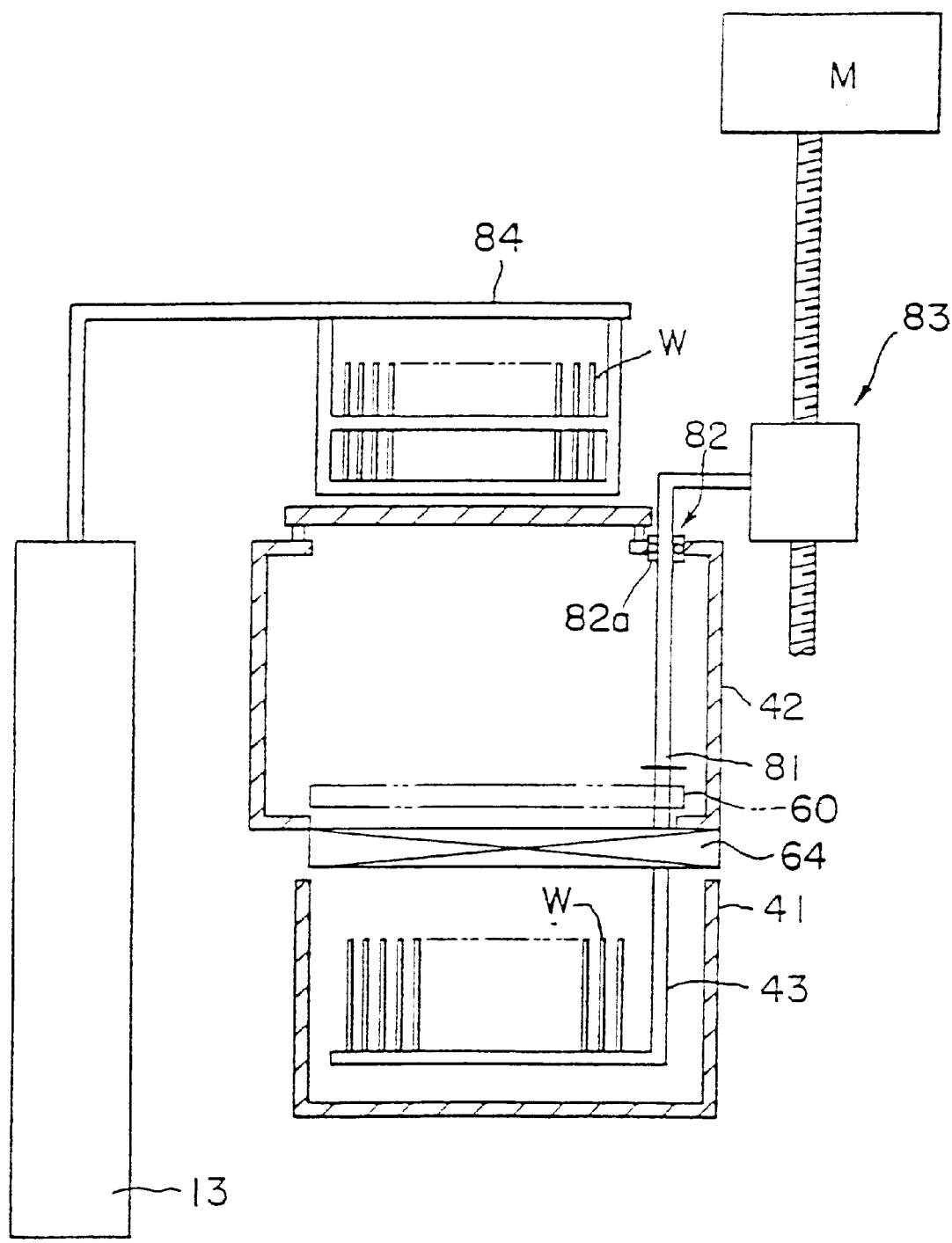
FIG. 5 is another longitudinal cross sectional side view of the cleaning unit of FIG. 4.

A guide elevating rod 81 is fixed to an upper end of the wafer guide 43. As shown in FIGS. 5 to 7, the guide elevating rod 81 is adapted so as to move upward and downward, projecting to the outside through a gripping mechanism 82 arranged on the top of the drying chamber 42. The gripping mechanism 82 includes an air grip seal 82a surrounding the guide elevating rod 81. When driving the guide elevating rod 81 up and down, air is released from the air grip seal 82a. On the contrary, when it is required to close up the drying chamber 42, the air grip seal 82a is inflated.

The upper end of the guide elevating rod 81 is connected with a wafer-guide Z-axis mechanism 83 arranged behind the drying chamber 42. Since the wafer-guide Z-axis mechanism 83 operates to move the guide elevating rod 81 up and down, the wafers W carried by the wafer guide 43 are transported between the cleaning bath 41 and the drying chamber 42 through the lower opening 62. Further, as shown in FIG. 5, the wafer transfer unit 13 (see FIG. 3) is arranged in front of the cleaning unit 27. In operation, a wafer chuck 84 provided on the wafer transfer unit 13 receives, for example, fifty sheets of wafers W from the neighboring wash cleaning bath 26 and delivers them to the wafer guide 43 in the drying chamber 42. Furthermore, the wafer chuck 84 receives, for example, fifty sheets of wafers W from the wafer guide 43 in the drying chamber 42 and delivers them to the unloader part 15 of the unloading section 4.

Figure 4:
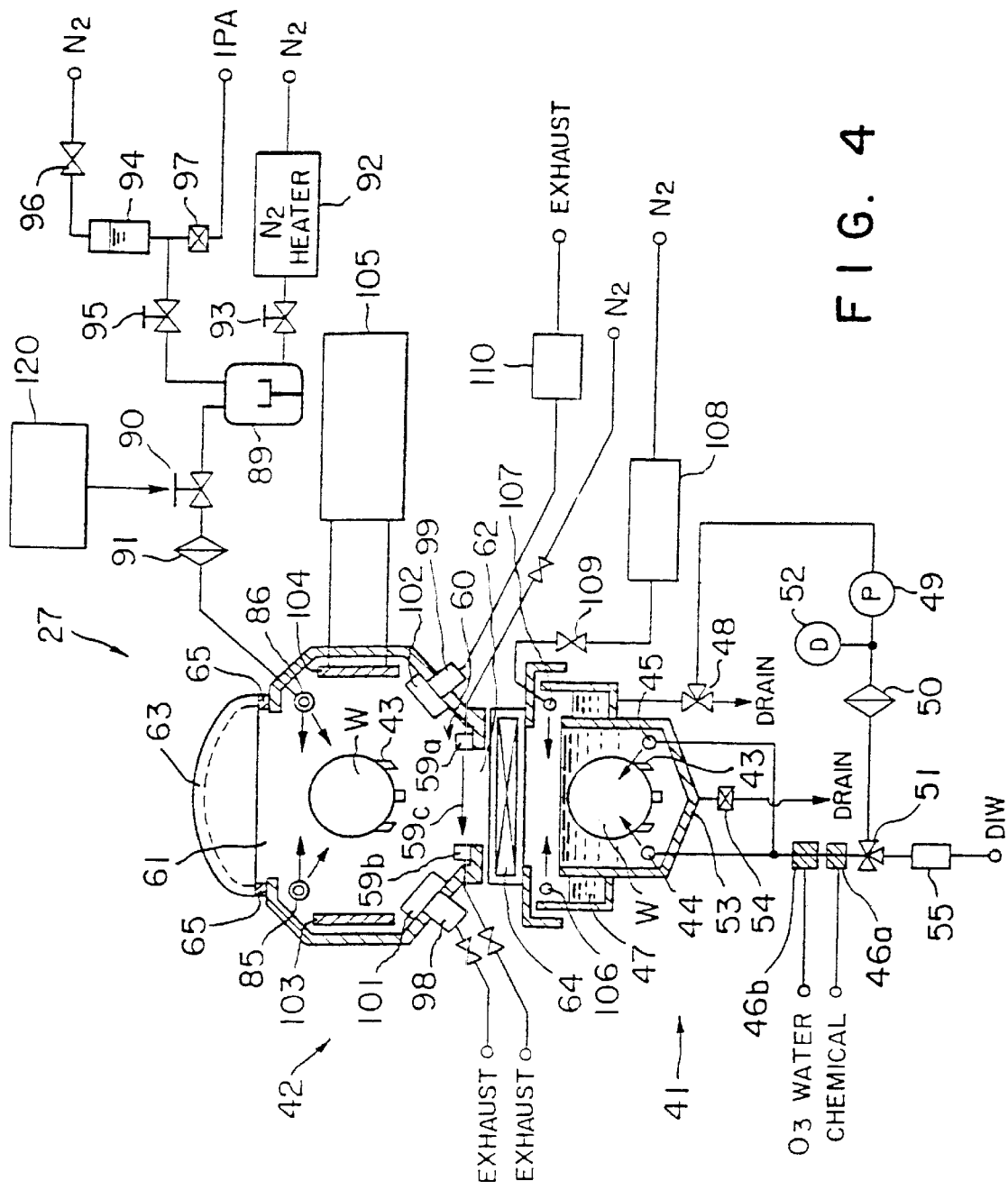
FIG. 4 is a longitudinal cross sectional front view of a cleaning unit of the cleaning apparatus of FIG. 2.
Figure 13:
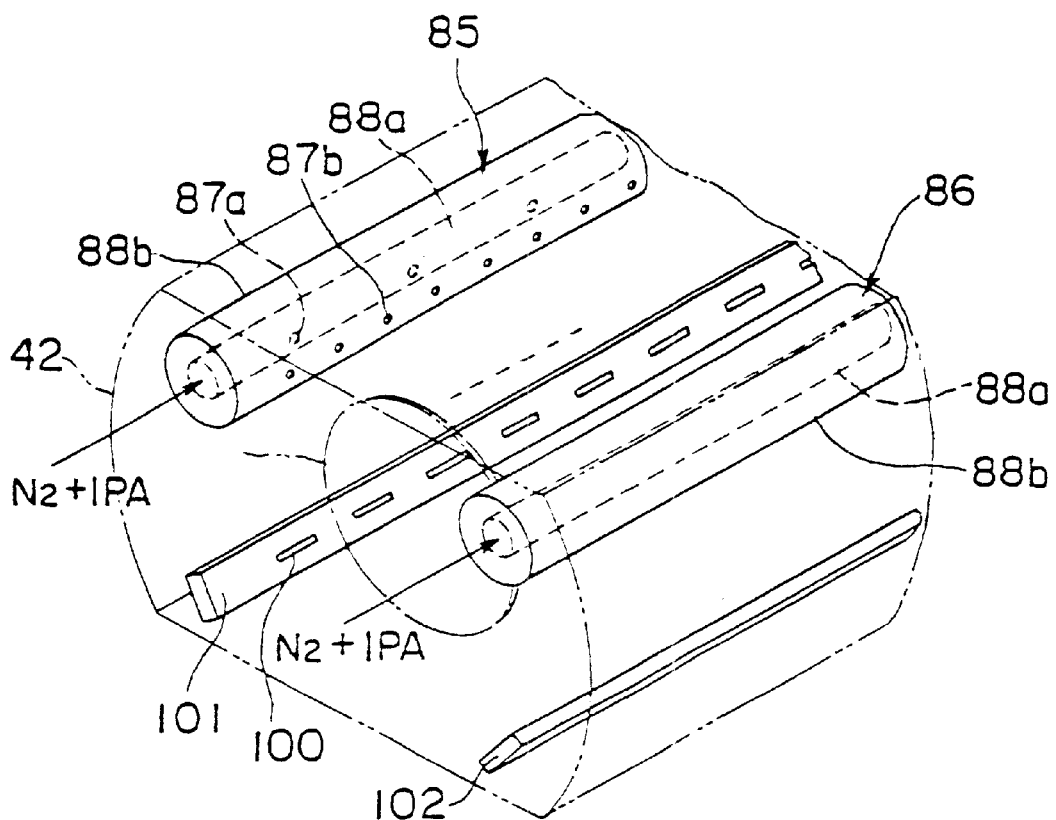
FIG. 13 is a perspective view showing nozzles and exhaust ports of the cleaning unit of FIG. 4.
Figure 14:
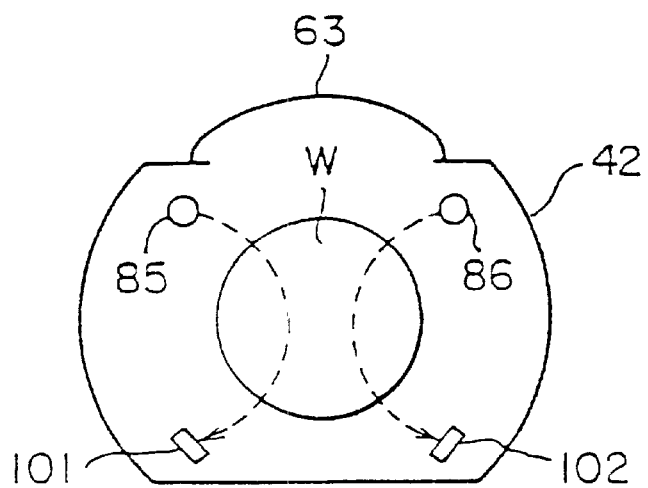
FIG. 14 is a view for explanation of an operation of rectifying plates of the cleaning unit of FIG. 4.

As shown in FIGS. 4 and 13, on both sides of the upper part of the drying chamber 42, two nozzles 85, 86 are arranged so as to blow the nitrogen gas and a mixed gas of nitrogen and the IPA over the wafers W carried by the wafer guide 43 in a downward-flowing manner. Each of the nozzles 85, 86 is constituted by an inside pipe 88a and an outside pipe 88b having the pipe 88a inserted therein. The inside pipe 88a is provided, along a direction to arrange the wafers W, with a plurality of gas outlets 87a at intervals of a predetermined length. On the other hand, the outside pipe 88b is provided, along the arrangement direction of the wafers W, with a plurality of gas outlets 87b at intervals of a constant distance which is smaller than the predetermined length between the adjoining gas outlets 87a and which may be a pitch of the wafers W adjoining, for example. That is, the nozzles 85, 86 are constructed in a manner that gas, which has been ejected from a small number of gas outlets 87a in the inside pipe 88a, passes through a space between the circumferential face of the inside pipe 88a and that of the outside pipe 88b and subsequently flows into the drying chamber 42 through a large number of gas outlets 87b in the outside pipe 88b. With the above-mentioned arrangement, it is possible to reduce fluctuations in volume (flow rate) and temperature of the gas ejected from the gas outlets 87b of the nozzles 85, 86, which fluctuations would be caused in case of supplying gas from one end of the inside pipe 88a.

Into the nozzles 85, 86, a mixed gas composed of the IPA and heated nitrogen gas is supplied from an IPA evaporator 89 through a control valve 90 and a filter 91. Into the IPA evaporator 89, the heated nitrogen gas is supplied from a nitrogen heater 92 through a control valve 93, while the IPA is also supplied from an IPA tank 94 through a control valve 95. Similarly, the nitrogen is supplied to the IPA tank 94 through a control valve 96, while the IPA is also supplied to the IPA tank 94 through a control valve 97.

On the other hand, as shown in FIGS. 4 and 13, the drying chamber 42 is provided, on both sides of the lower part, with exhaust ports 98, 99 for discharging the nitrogen gas etc. blown out of the nozzles 85, 86. The exhaust ports 98, 99 are communicated with a exhaust pump 110. Also communicated with the exhaust ports 98, 99 are respective rectifying plates 101, 102 as rectifying means, which having a plurality of inlets 100, 100, . . . , 100 for sucking the nitrogen gas etc., which have been blown out of the nozzles 85, 86, through respective parts at the lower part of the drying chamber 42 uniformly. With the arrangement, as shown by dotted lines of FIG. 14, the nitrogen gas etc., which have been blown out of the injection holes 87 of the nozzles 85, 86, are flowing on the surfaces of the wafers W and subsequently sucked from the inlets 100 of the rectifying plates 101, 102. Thus, owing to the above-mentioned flow of the nitrogen gas etc., it is possible to prevent the occurrence of turbulence in the flows of the nitrogen gas etc. Note, the drying chamber 42 is also provided, at the lower part, with a drain port (not shown) for discharging the liquids.

Again in FIG. 4, a pair of panel heaters 103, 104 are arranged on both sides of a center of the drying chamber 42. These panel heaters 103, 104 are electrically connected to a panel heater controller 105 for controlling the temperature in the chamber 42. In this way, the temperature of the chamber 42 is maintained to the extent that, for example, the IPA boils.

As shown in FIG. 4, provided between the cleaning bath 41 and the drying chamber 42, for example, on both sides of a space above the surface of the bath 41 are nozzles 106, 107 which blow the nitrogen gas against the wafers W during transporting from the bath 41 to the chamber 42. The structures of the nozzles 106, 107 are substantially similar to those of the above-mentioned nozzles 85, 86. Into the nozzles 106, 107, the cooled nitrogen gas is supplied through a cooler 108 for cooling the nitrogen gas to the 0—a normal temperature (° C.) degree range, more preferably 5° C., and a control valve 109.

Figure 15:
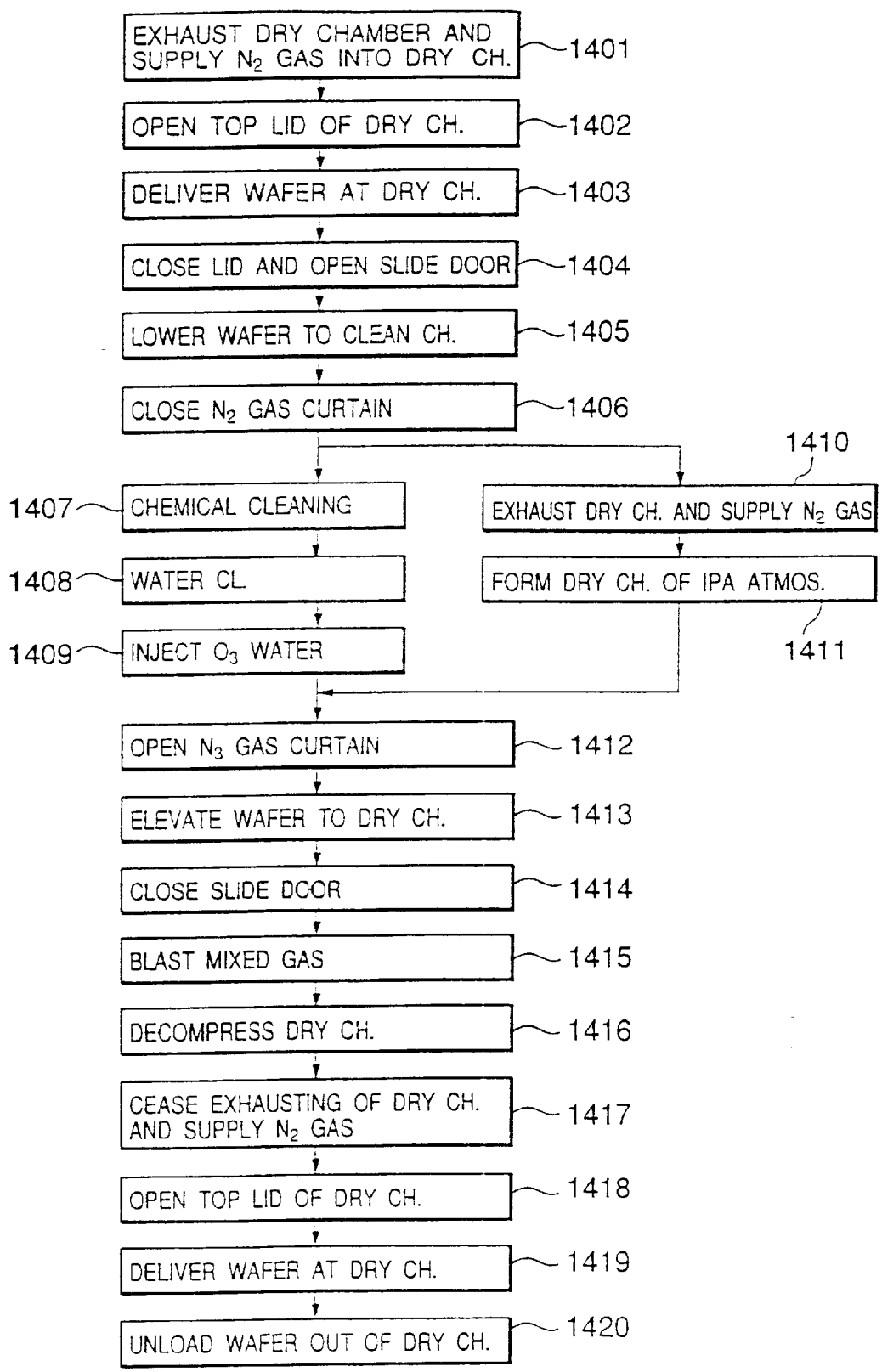
FIG. 15 is a flow chart of an operation of the cleaning unit of FIG. 4.

We now describe an operation of the cleaning apparatus 27 constructed above, in accordance with a flow chart of FIG. 15. Note, the following operational control is executed by a not-shown controller.

Figure 16:
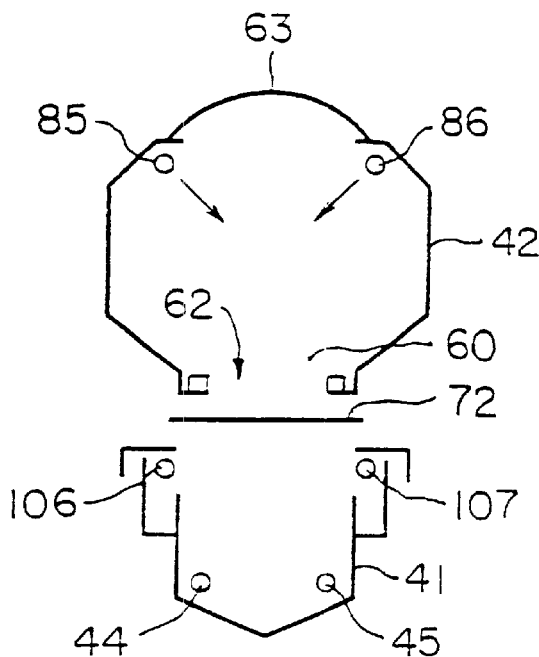
FIG. 16 is a schematic view showing the operation of the cleaning unit of FIG. 4, corresponding to a step 1401 of FIG. 15.
Figure 17:
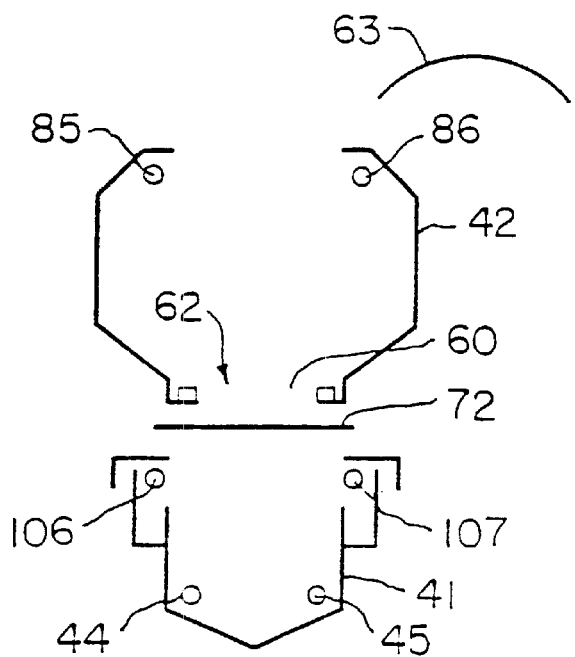
FIG. 17 is a schematic view showing the operation of the cleaning unit of FIG. 4, corresponding to a step 1402 of FIG. 15.

First of all, on condition of closing the lid 63 on the top of the chamber 42 and the slide door 72 (or even opening) prior to bringing the wafers W from the outside into the drying chamber 42, the atmosphere in the drying chamber 42 (or the atmosphere in the drying chamber 42 and the processing bath 41) is replaced with nitrogen gas ejected from the nozzles 85, 86, while exhausting the atmosphere in the drying chamber 42 (see step 1401 of FIG. 16). Next, the lid 63 on the top of the drying chamber 42 is opened (step 1402 of FIG. 17) and then, the wafer chuck 84 is lowered into the chamber 42 and the wafers W are delivered to the wafer guide 43 in the chamber 42 (step 1403 of FIG. 18).

Figure 20:
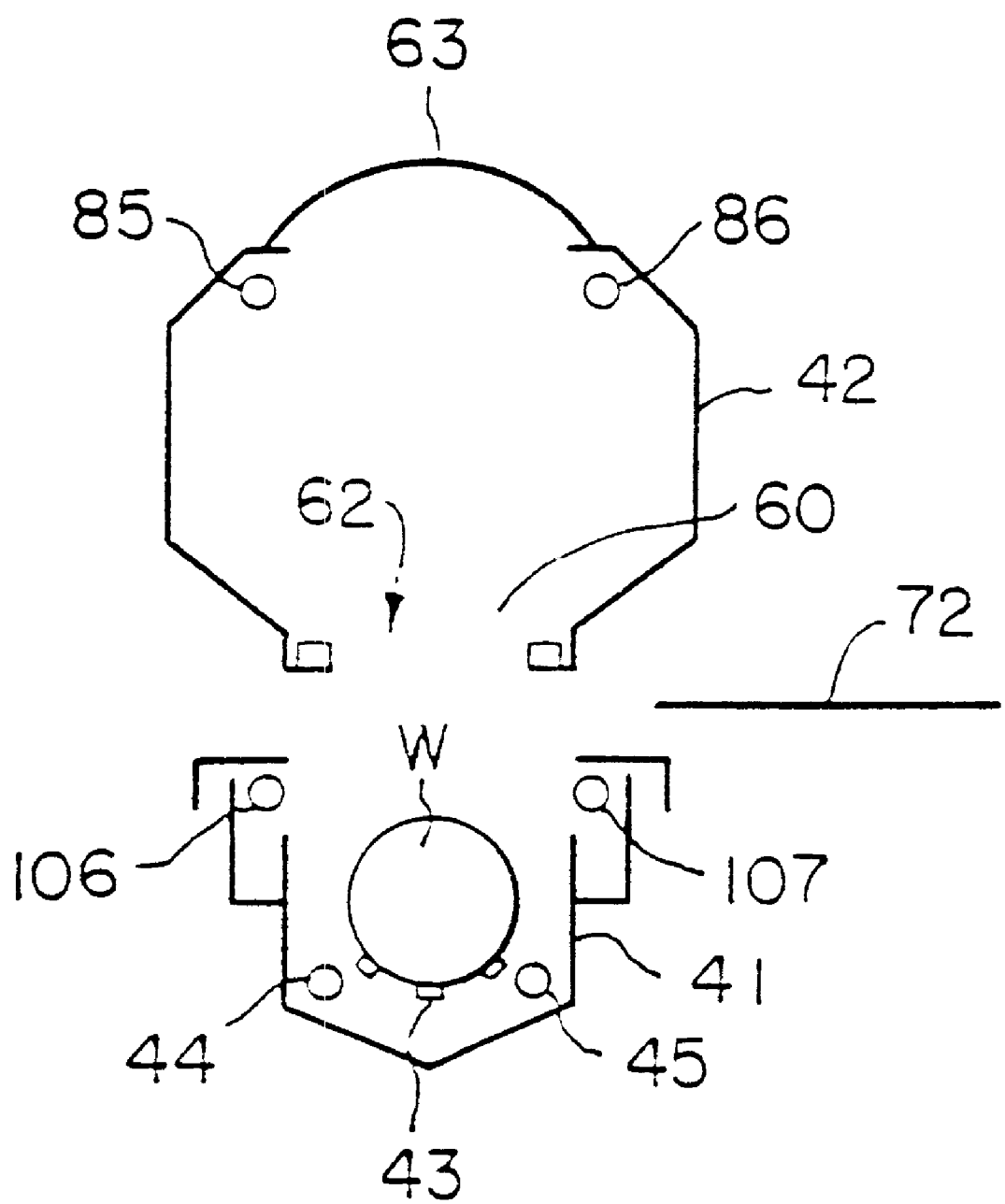
FIG. 20 is a schematic view showing the operation of the cleaning unit of FIG. 4, corresponding to a step 1405 of FIG. 15.

At sequent step 1404 of FIG. 19, it is executed to close the lid 63 on the top of the chamber 42 and open the slide door 72 at the bottom of the chamber 42 (see FIG. 19). Then, the wafer guide 43 carrying the wafers W is lowered to transfer them into the cleaning bath 41 (step 1405 of FIG. 20) and the nitrogen-gas curtain screening arrangement 60 is activated to close the opening 62 at the bottom of the drying chamber 42 by the current layer 59c of nitrogen gas (step 1406 of FIG. 21).

Thereafter, in the cleaning bath 41, it is executed to inject the mixture of $HF/H_2O$ through the nozzles 44, 45 and subsequently immerse the wafers W into the reserved mixture of $HF/H_2O$ for chemical cleaning (step 1407 of FIG. 22). In this step, it is also applicable that the mixture has been reserved in the cleaning bath 41 in advanced, before the wafers are transported into the cleaning bath 41. The mixture of $HF/H_2O$ ejected from the nozzles 44, 45 forms a current directing the wafers W in the cleaning bath 41 thereby to promote the chemical cleaning. Next, the mixture of $HF/H_2O$ is discharged and thereafter, the DIW is ejected from the nozzles 44, 45 to rinse the wafers W (step 1408 of FIG. 22). As well as the mixture of $HF/H_2O$, the DIW ejected from the nozzles 44, 45 forms a current directing the wafers W in the cleaning bath 41 thereby to promote the rinsing process. Note, in the modification, the supply of DIW may be started without discharging the mixture of $HF/H_2O$ so that the density of the mixture becomes to be thin gradually. Subsequently, the ozone water is ejected from the nozzles 44, 45 to form thin films of pure silicon oxide on silicon surfaces of the wafers W (step 1409 of FIG. 22). If necessary, the DIW may be subsequently ejected from the nozzles 44, 45 to remove the ozone water sticking on the surfaces of the wafers W.

On the other hand, while the above cleaning process is carried out, the nitrogen gas for interchange is supplied into the drying chamber 42 through the nozzles 85, 86 (step 1412 of FIG. 22). Thereafter, the IPA or the mixture of the IPA and nitrogen is blown out from the nozzles 85, 86, so that the drying chamber 42 is filled up with the atmosphere of IPA (step 1411).

Figure 23:
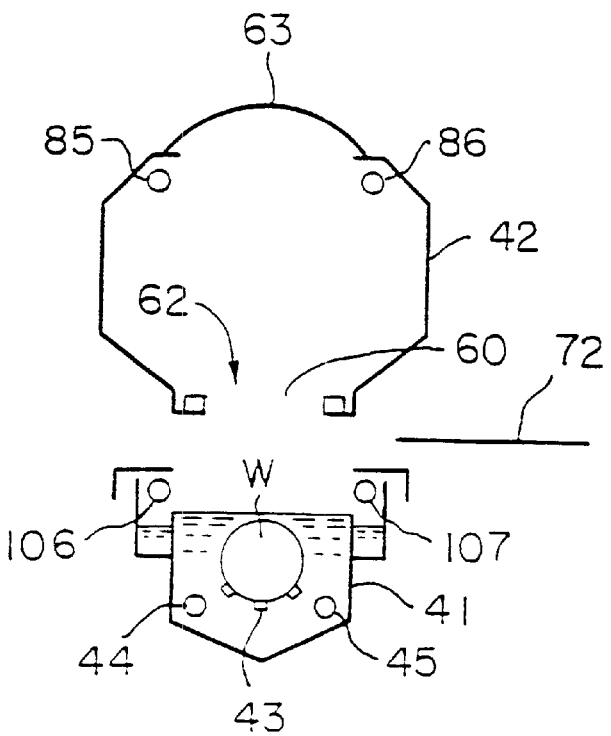
FIG. 23 is a schematic view showing the operation of the cleaning unit of FIG. 4, corresponding to a step 1412 of FIG. 15.
Figure 24:
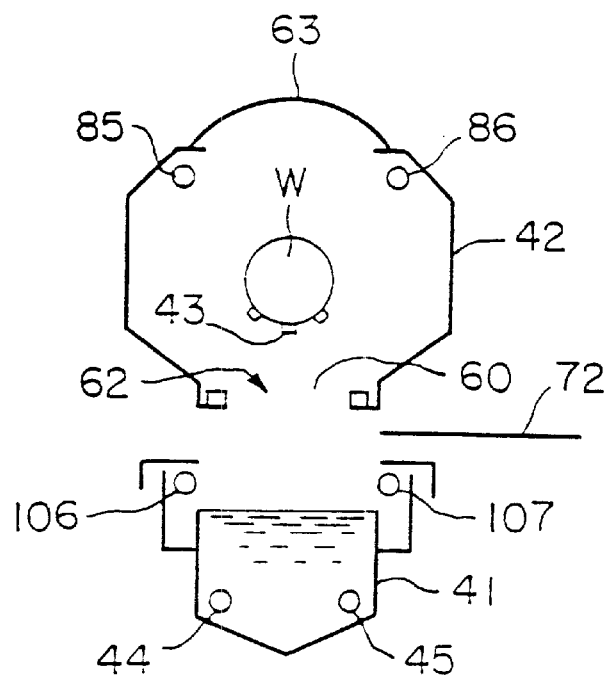
FIG. 24 is a schematic view showing the operation of the cleaning unit of FIG. 4, corresponding to a step 1413 of FIG. 15.

Next, it is executed to cease operating of the nitrogen-gas curtain screening arrangement 60 and open the nitrogeng-gas curtain 59c (step 1412 of FIG. 23) and the wafer guide 43 carrying the wafers W is elevated to transport them into the drying chamber 42 successively (step 1413 of FIG. 24). Note, in the modification, the wafers W may be conveyed into the drying chamber 42 while closing the nitrogen-gas curtain 59c without stopping the operation of the nitrogen-gas curtain screening arrangement 60. During the transportation of the wafers W, the nitrogen gas is blown against the wafers W on transportation from the cleaning bath 41 to the drying chamber 42 by the nozzles 106, 107.

Figure 25:
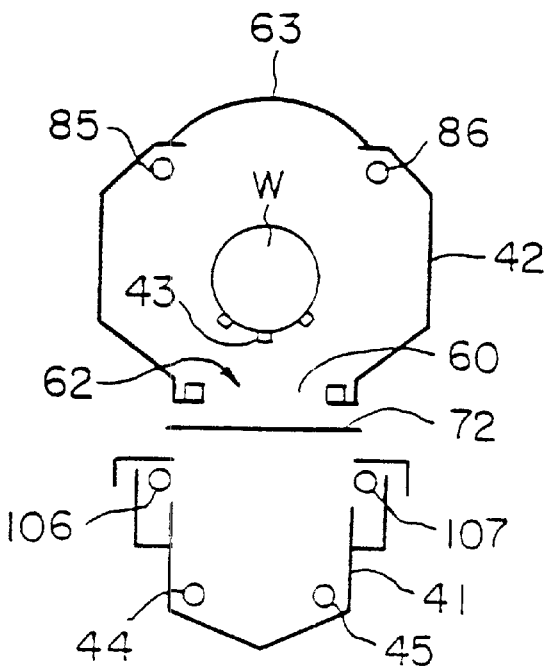
FIG. 25 is a schematic view showing the operation of the cleaning unit of FIG. 4, corresponding to a step 1414 of FIG. 15.
Figure 26:
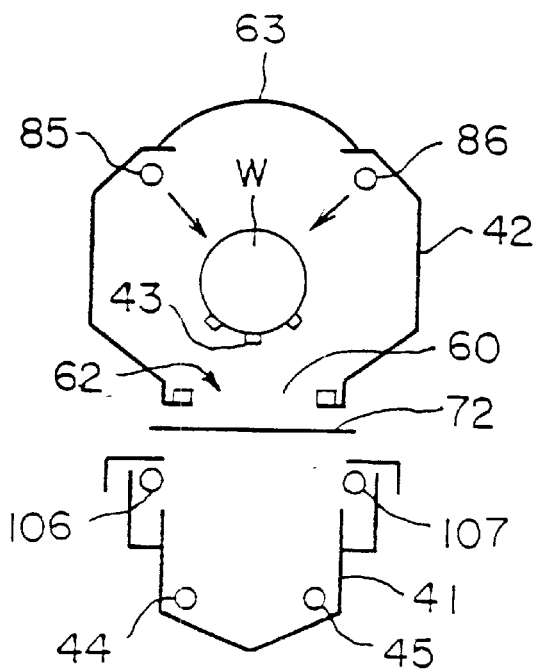
FIG. 26 is a schematic view showing the operation of the cleaning unit of FIG. 4, corresponding to steps 1415 to 1417 of FIG. 15.
Figure 30:
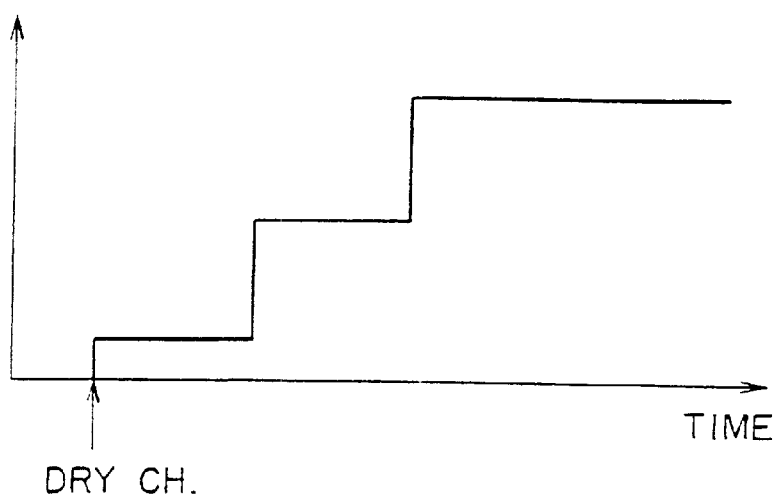
FIG. 30 is a relationship between a blasting volume of nitrogen gas required for recovering the drying chamber of an atmospheric pressure and passing time at the step 1417 of FIG. 15.

Subsequently, upon closing the slide door 72 at the bottom of the drying chamber 42 (step 1414 of FIG. 25), the IPA or the mixture of the IPA and nitrogen is blown against the wafers W in the drying chamber 42 through the nozzles 85, 86 downwardly (step 1415 of FIG. 26). After that, the drying chamber 42 is exhausted to be decompressed (step 1416 of FIG. 26). After ceasing exhausting of the drying chamber 42, the nitrogen gas is introduced into the drying chamber 42 through the nozzles 85, 86 to recover the chamber 42 of the atmospheric pressure (step 1417 of FIG. 26). Then, as shown in FIG. 30 for instance, the control valve 90 is controlled so that a blasting volume of nitrogen gas is relatively small at the beginning of the recovering and subsequently, increased gradually or in a stepped manner.

Figure 27:
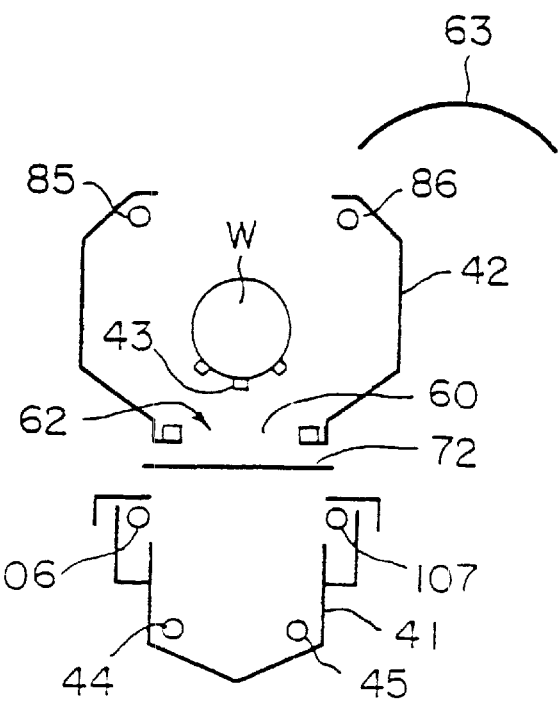
FIG. 27 is a schematic view showing the operation of the cleaning unit of FIG. 4, corresponding to a step 1418 of FIG. 15.
Figure 28:
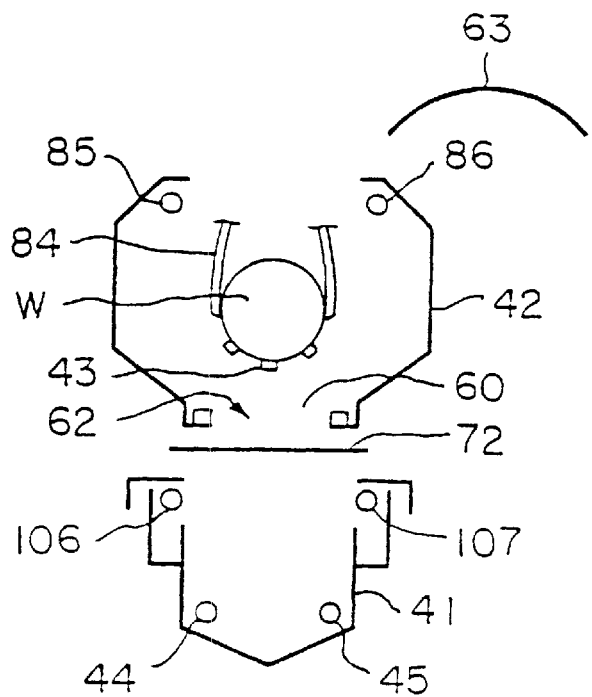
FIG. 28 is a schematic view showing the operation of the cleaning unit of FIG. 4, corresponding to a step 1419 of FIG. 15.
Figure 29:
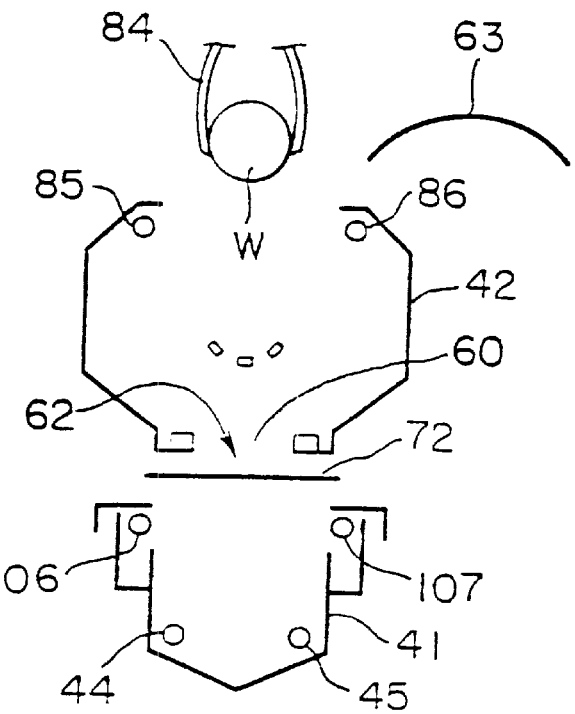
FIG. 29 is a schematic view showing the operation of the cleaning unit of FIG. 4, corresponding to a step 1420 of FIG. 15.

At sequent step 1418 of FIG. 27, it is executed to open the lid 63 on the top of the drying chamber 42 and thereafter, the wafer chuck 84 is lowered into the chamber 42 to receive the wafers W from the wafer guide 43 (step 1419 of FIG. 28). Then, the wafer chuck 84 is elevated to unload the wafers W to the outside of the drying chamber 42 (step 1420 of FIG. 29).

Thus, in accordance with the cleaning apparatus 27 of the embodiment, the drying chamber 42 and the cleaning bath 41 are separated from each other up and down and the opening 62 of the drying chamber 42 is screened by the nitrogen-gas curtain 59c during the cleaning process in the cleaning bath 41, while the opening 62 of the drying chamber 42 is closed by the slide door 72 at the drying process in the drying chamber 42. Therefore, it is possible to prevent the chemical in the cleaning bath 41 from exerting bad influences on the drying process of the wafers W. In addition, since the arrangement allows the drying chamber 42 and the cleaning bath 41 to be designed under respective conditions independent of each other, it is possible to make the cleaning process more rapid and further miniaturize the cleaning apparatus 27 because of the enhanced degree of freedom in the process design. For instance, in order to finish off the drying process quickly, the drying chamber 42 may be provided with the panel heaters 103, 104 for heating the interior of the chamber 42. Or again, the atmosphere in the drying chamber 42 may be replaced with the IPA while cleaning the wafers W in the cleaning bath 41 in view of the prompt drying process.

Further, since the drying chamber 42 can be constructed to be compact in comparison with that of the conventional cleaning apparatus where the processing bath and the drying chamber have been accommodated in one chamber, it is possible to carry out the drying process more effectively. Furthermore, since it is possible to decrease the volume of the drying chamber 42 to the utmost, there is no need to form the drying chamber 42 with a great pressure tightness. Thus, it is possible to reduce the wall thickness of the drying chamber 42 and decrease the required power of the vacuum pump 110 for decompression.

In the cleaning apparatus 27 of the embodiment, it is possible to prevent the occurrence of water marks on the surfaces of the wafers W because the ozone cleaning is carried out to form the thin film of pure silicon oxide on the silicon surfaces of the wafers W after executing the chemical cleaning using the mixture of $HF/H_2O$ and the water cleaning.

Further, since, in the respective processes of replacing the atmosphere in the drying chamber 42 with the nitrogen gas, it is blown out from the nozzles 85, 86 while exhausting the drying chamber 42, it is possible to enhance the efficiency of replacement.

Additionally, as the atmosphere of the drying chamber 42 is replaced with the nitrogen gas prior to the loading of the wafers W into the drying chamber 42, it is possible to shorten the time required for the above replacing process of the nitrogen gas to be processed during the cleaning process of the wafers W. Moreover, since the replacement of the nitrogen gas to be processed during the cleaning process of the wafers W may be started from a state having a lower oxygen concentration than that of the air outside, it is possible to shorten the time required for lowering the concentration of oxygen to its permissible value remarkably.

According to the cleaning apparatus 27 of the embodiment, when recovering the drying chamber 42 of the atmospheric pressure by introducing the nitrogen gas into the chamber 42 from its decompressed condition, the blasting volume of nitrogen gas is relatively small at the beginning of the recovering and subsequently, increased gradually or in the stepped manner. Consequently, it is possible to prevent particles on the inner wall of the drying chamber 42 from flying up by the nitrogen-gas flows introduced into the chamber 42 and sticking on the wafers W after cleaning or drying.

Now, it is noted that the present invention is not limited to the above-mentioned embodiment and various changes and modifications may be made within a scope of concept of the art.

For example, although the nitrogen-gas curtain screening arrangement 60 is constructed so that the current layer (nitrogen-gas curtain) 59c screens the opening 62 of the drying chamber 42 during the cleaning of the wafers W in the cleaning bath 41, the arrangement 60 may be removed within the permissible range of the bad influence due to the chemical mists entering from the cleaning bath 41 to the drying chamber 42.

Note, in order to prevent the chemical mists from entering from the cleaning bath 41 to the drying chamber 42, the nitrogen gas may be introduced into the drying chamber 42 through the nozzles 85, 86 thereby to bring the atmosphere in the drying chamber 42 into a high-pressure condition in comparison with that in the cleaning bath 41.

Further, as means for screening the opening 62 of the drying chamber 42 in process of cleaning the wafers W in the cleaning bath 41, as shown in FIG. 31, a combination of a rotary doors arrangement and the nitrogen-gas curtain screening arrangement is applicable to the means. The rotary doors arrangement is constituted by a pair of rotary doors 121 and a pair of driving units 122 for rotating the rotary doors 121 respectively. The respective rotary doors 121 also serve as structures of the nitrogen-gas exhaust part 59a and the nitrogen-gas intake part 59b between which the current layer (nitrogen-gas curtain) 59c is formed for screening a clearance between the respective ends of the closing rotary doors 121. Note, the respective rotary doors 121 and the nitrogen-gas curtain 59c are adapted so as to open or close simultaneously.

Again, although the nitrogen gas is used as the inert gas in the above-mentioned embodiment, other inert gases, such as argon (Ar), helium (He) etc., may be used as a substitute of the nitrogen gas. It is obvious that the heating of these inert gases in the drying step allows the drying process to be carried out more effectively. While, needless to say, they do not have to be heated.

Although the IPA is employed as a water-soluble organic solvent having an function to decrease the surface tension of pure water with respect to the object to be processed in the embodiment, the IPA may be replaced with other organic solvents, for example, single-charged alcohol (e.g. methanol), ketonic kinds (e.g. acetone), ether kinds (e.g. methyl alcohol), multicharged alcohol (e.g. ethylene glycol) or the like.

Although the chemical treatment using the mixture of $HF/H_2O$ and the rinsing and drying processes using the pure water are executed in the cleaning apparatus 27 in the above-mentioned embodiment, it should be understood that a cleaning apparatus for and a method of executing at least the drying process and one or more other processes will be included in the scope of the invention. For example, the chemical process using the mixture of $HF/H_2O$, the rinsing process using the pure water, the chemical process using the mixture of $NH_4/H_2O_2/H_2O$, and the chemical process using the mixture of $HCl/H_2O_2/H_2O$ etc. are applicable to the above other processes. Accordingly, of course, the cleaning apparatus of the invention may be constructed so as to carry out, for example, the chemical process using the mixture of $NH_4/H_2O_2/H_2O$, the chemical process using the mixture of $HCl/H_2O_2/H_2O$, the chemical process using the mixture of $HF/H_2O$, the rinsing process using the pure water, and the drying process.

Although the above-mentioned embodiment is one example of the cleaning apparatus of the invention in association with a cleaning equipment having the processing baths in processing order, it is possible to use the present cleaning apparatus as a stand alone type apparatus. In this case, for example, it is also possible to construct the stand alone apparatus by connecting a transfer section having the loader part and unloader part with the present cleaning apparatus.

In addition, it will be understood that the object to be processed is not limited to the semi-conductor wafer of the embodiment, so that a LCD substrate, a glass substrate, a CD substrate, a photomask, a print substrate, a ceramic substrate or the like is applicable to the object to be processed by the present apparatus and method.

As mentioned above, according to the cleaning apparatus of the present invention, as the inert gas is introduced into the drying chamber so that the atmosphere in the drying chamber is brought to the high-pressure condition in comparison with the processing bath, it is possible to prevent the entering of chemicals from the processing bath to the drying chamber. Further, since the forthcoming process in the next processing bath can be prepared while the drying process is executed, it is possible to improve throughput of the cleaning apparatus. Additionally, since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the above-mentioned arrangement allows the volume of the drying chamber to be reduced, it is possible to reduce the wall thickness of the drying chamber and the processing bath when it is required to decompress the drying chamber while filling up with the atmosphere of the organic solvent. In addition, it is possible to make the decompression with the low-powered vacuum pump.

Additionally, according to the cleaning apparatus of the invention, owing to the provision of the screening means for screening the opening by the current layer of inert gas, it is possible to screen the processing bath from the drying chamber at the chemical processing for the object, so that the entering of chemicals from the processing bath to the drying chamber can be prevented.

Moreover, according to the cleaning apparatus of the invention, when closing the opening by the first and second doors, the clearance between the first and second doors can be screened by the flow of inert gas. Accordingly, it is possible to prevent an invasion of the chemical atmosphere from the processing bath to the drying chamber, furthermore.

Again, according to the cleaning method of the invention, since the drying chamber is separated from the processing bath, the forthcoming process in the next processing bath can be prepared while the drying process is executed, so that the throughput of the cleaning apparatus can be improved. Additionally, since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the above-mentioned arrangement allows the volume of the drying chamber to be reduced, it is possible to reduce the wall thickness of the drying chamber and the processing bath when it is required to decompress the drying chamber while filling up with the atmosphere of the organic solvent. In addition, it is possible to make the decompression with the low-powered vacuum pump.

What is claimed is:

1. A cleaning apparatus for cleaning an object to be processed, said apparatus comprising:
    a processing case enclosing a processing chamber for processing the object therein, the case having a hole;
    a holder for holding the object;
    a rod provided with the holder and extending through the hole; and
    an air gripping seal provided between an outer surface of the rod and a region of the case defining the hole,
    wherein the air gripping seal is in a deflated state by sucking air therefrom in order to form a clearance between the outer surface of the rod and the region of the case defining the hole when the rod moves through the hole,
    and wherein the air gripping seal is in an inflated state by providing air therein in order to seal a gap between the outer surface of the rod and the region of the case defining the hole when the rod is in a state of rest.

2. A cleaning apparatus according to claim 1, wherein the air gripping seal is provided on the region of the case defining the hole.

3. A cleaning apparatus according to claim 1, wherein the rod is movable in a direction of the axis of the rod.

4. A cleaning apparatus according to claim 1, further comprising:
    a driver provided with the rod and moving the rod in order to move the object in the case.

5. A cleaning apparatus according to claim 1, wherein the processing case has a drying case enclosing a drying chamber for drying the object and a processing bath for storing processing liquid in which the object is immersed, the processing bath being located under the drying case.

6. A cleaning apparatus according to claim 5, wherein the hole of the case is located at the drying case.

7. A cleaning apparatus according to claim 6, wherein the processing bath has an upper opening in an upper portion, the drying chamber having a lower opening in a lower portion thereof, the lower opening being connected with the upper opening between the drying case and the processing bath, the object being transported through the lower opening and the upper opening.

8. A cleaning apparatus according to claim 7, wherein the hole is located at the upper portion of the drying case, the rod being arranged and movable in an up and down direction, and wherein the object held by the holder is transferred between the drying chamber and the processing bath through the lower opening and the upper opening by moving the rod in the up and down direction.

9. A cleaning apparatus according to claim 7, wherein the drying case has an upper opening for transferring the object therethrough and a lid covering the upper opening.

* * * * *